(12) United States Patent
Lei

(10) Patent No.: US 11,894,482 B2
(45) Date of Patent: Feb. 6, 2024

(54) SYSTEMS AND METHODS FOR MAKING SOLAR PANELS OR COMPONENTS THEREOF

(71) Applicant: Dual Helios Semiconductor Equipment Company, Inc., Jiaxing (CN)

(72) Inventor: Lawrence Chung-Lai Lei, Milpitas, CA (US)

(73) Assignee: Dual Helios Semiconductor Equipment Company, Inc., Jiaxing (CN)

( * ) Notice: Subject to any disclaimer, the term of this patent is extended or adjusted under 35 U.S.C. 154(b) by 0 days.

(21) Appl. No.: 18/085,344

(22) Filed: Dec. 20, 2022

(65) Prior Publication Data

US 2023/0131921 A1 Apr. 27, 2023

Related U.S. Application Data

(62) Division of application No. 17/539,912, filed on Dec. 1, 2021.

(30) Foreign Application Priority Data

Sep. 29, 2021 (CN) .......................... 202111148814.6
Sep. 29, 2021 (CN) .......................... 202111149234.9

(51) Int. Cl.
*H01L 31/18* (2006.01)
*H01L 31/048* (2014.01)
*H01L 31/075* (2012.01)

(52) U.S. Cl.
CPC .......... *H01L 31/18* (2013.01); *H01L 31/0488* (2013.01); *H01L 31/075* (2013.01)

(58) Field of Classification Search
CPC ... H01L 31/18; H01L 31/0488; H01L 31/075; H01L 31/0201; H01L 31/0504; H01L 31/0747; H01L 31/1876; H01L 31/1884
See application file for complete search history.

(56) References Cited

U.S. PATENT DOCUMENTS

| 11,038,072 B2 | 6/2021 | Morad et al. |
| 2010/0047954 A1 | 2/2010 | Su et al. |
| 2010/0167503 A1* | 7/2010 | Lei ................... H01L 21/67173 |
| | | 414/805 |

(Continued)

OTHER PUBLICATIONS

Non-Final Office Action for U.S. Appl. No. 17/539,912 dated Jun. 29, 2023.

*Primary Examiner* — Jonathan Han
(74) *Attorney, Agent, or Firm* — Vista IP Law Group, LLP

(57) ABSTRACT

A system for wafer processing, includes: a frame comprising a frame opening; and a membrane configured to couple to the frame and to cover at least a part of the frame opening, the membrane comprising a membrane opening, wherein the membrane opening has a membrane opening area that is equal to or less than a frame opening area of the frame opening; wherein the membrane is configured for coupling with the wafer, wherein when the wafer is coupled with the membrane, the wafer covers the membrane opening, and wherein the membrane is configured to maintain the wafer at a certain position with respect to the frame; and wherein the membrane opening area is less than a total area of the wafer.

25 Claims, 29 Drawing Sheets

(56) References Cited

U.S. PATENT DOCUMENTS

| | | | |
|---|---|---|---|
| 2013/0276978 A1* | 10/2013 | Bluck | H01L 21/6734 |
| | | | 118/500 |
| 2020/0313019 A1* | 10/2020 | Ueyama | H01L 31/03762 |
| 2021/0082634 A1* | 3/2021 | Lee | H01G 9/2081 |
| 2021/0288196 A1* | 9/2021 | Nakano | H01L 31/1804 |

* cited by examiner

Single row module

Double row module

One piece module

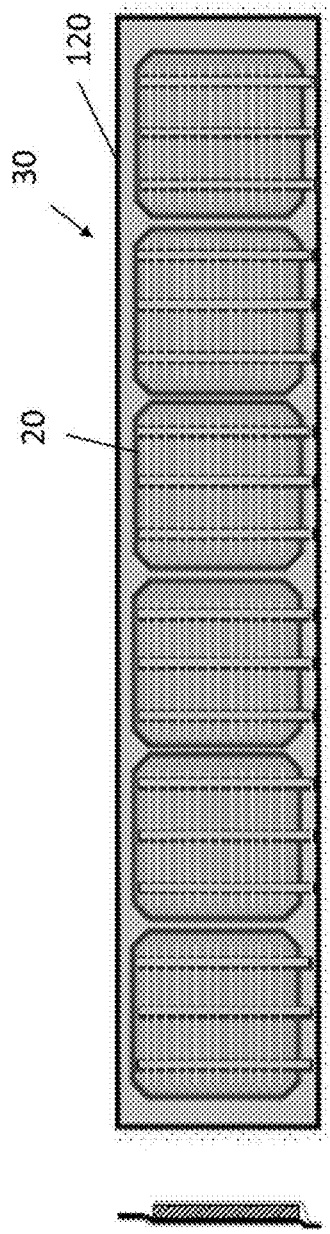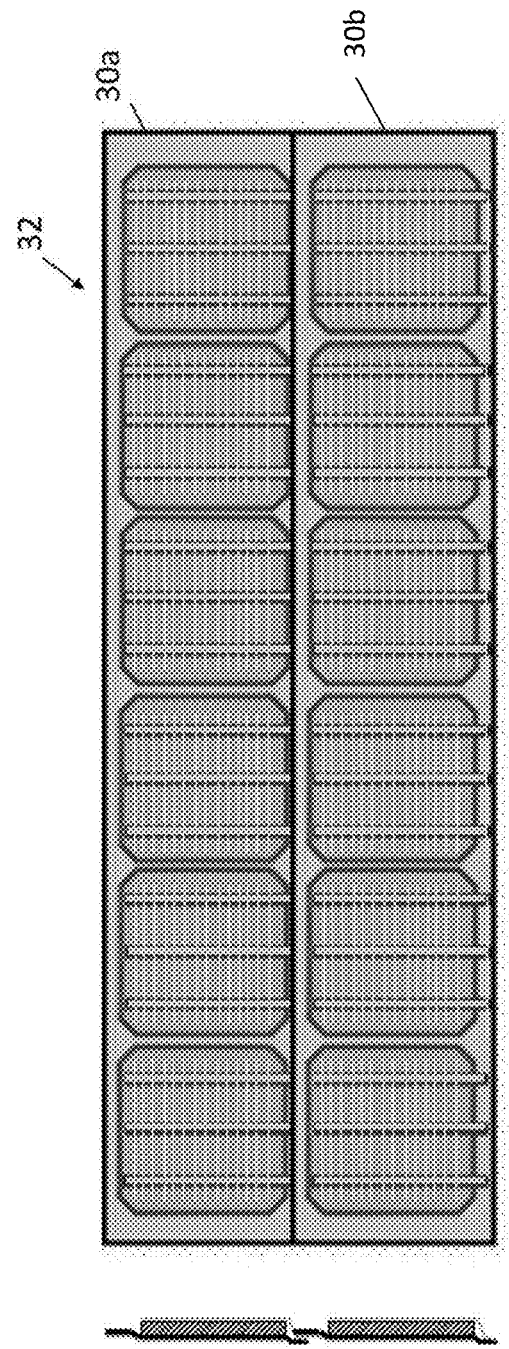
FIG. 15A
FIG. 15B

SYSTEMS AND METHODS FOR MAKING SOLAR PANELS OR COMPONENTS THEREOF

RELATED APPLICATION DATA

This application is a divisional of U.S. patent application Ser. No. 17/539,912, filed Dec. 1, 2021, which claims priority to, and the benefit of, Chinese patent application No. 202111148814.6 filed on Sep. 29, 2021, and Chinese patent application No. 202111149234.9 filed on Sep. 29, 2021. The entire disclosures of the above applications are expressly incorporated by reference herein.

FIELD

The present disclosure relates to the field of photovoltaic and solar cell, manufacturing system thereof, and manufacturing method thereof.

BACKGROUND

The solar cell is also referred to as a photovoltaic cell, is a power generation technology for directly converting solar radiation into electric energy by utilizing the photovoltaic effect, and has the advantages of sufficient resources, cleaning, safety, long service life and the like, and is considered to be one of the most promising renewable energy technologies.

The silicon heterojunction battery in the current solar cell has the advantages of low temperature preparation, simple process steps, good temperature coefficient, good product stability and the like, and is expected to be one of the mainstream technologies of the photovoltaic industry. The silicon heterojunction battery comprises a single crystal N doped silicon wafer, an intrinsic amorphous silicon layer located on the front side and the back side of the monocrystalline silicon wafer, an Phosphorus doped (N type) intrinsic layer on the thin film silicon intrinsic layer on the front side, a Boron-doped (P type) layer on the thin film silicon intrinsic layer on the back side, and a conductive transparent layer located on the N-type layer and the P-type layer on both sides of the wafer.

However, the existing system for preparing the silicon heterojunction battery is large in occupied area and high in cost because of breaking up the system into several sections of reactive chambers and requiring automation equipment in distributing wafers onto a wafer carrier and then collecting the wafers back after processing. There is also a flipping of wafers required after the back side deposition and moving the substrates onto a different tray to prevent cross contamination.

SUMMARY

One technical problem to be solved by one or more embodiments described herein is to provide a solar cell, a manufacturing system thereof, a manufacturing method, a transport device and a movable bearing frame, so that the occupied area of the manufacturing system of the solar cell is reduced, and the cost is saved.

A system for wafer processing, includes: a frame comprising a frame opening; and a membrane configured to couple to the frame and to cover at least a part of the frame opening, the membrane comprising a membrane opening, wherein the membrane opening has a membrane opening area that is equal to or less than a frame opening area of the frame opening; wherein the membrane is configured for coupling with the wafer, wherein when the wafer is coupled with the membrane, the wafer covers the membrane opening, and wherein the membrane is configured to maintain the wafer at a certain position with respect to the frame; and wherein the membrane opening area is less than a total area of the wafer.

Optionally, the system further comprises the wafer, wherein the wafer is coupled to the membrane, and covers the membrane opening.

Optionally, the wafer is coupled to the membrane via an adhesive or via one or more clamps.

Optionally, the membrane is under tension when the membrane is coupled to the frame.

Optionally, at least a part of the membrane is a component of a solar cell.

Optionally, the system further comprises a transport mechanism configured to transport the frame while the membrane is coupled to the frame, and while the wafer is coupled to the membrane.

Optionally, the frame comprises a first magnet, and wherein the transport mechanism comprises a second magnet configured to interact with the first magnet of the frame to maintain the frame at a certain position with respect to the transport mechanism.

Optionally, the system further comprises a plurality of processing stations, wherein the transport mechanism is configured to move the frame, the membrane, and the wafer sequentially to the processing stations.

Optionally, the processing stations comprise at least two stations selected from the group consisting of an etching station configured to provide dry etching for the wafer, a PECVD station configured to provide PECVD deposition for the wafer, a pre-heat station, and a PVD station configured to provide PVD deposition for the wafer.

Optionally, the system further comprises a storage configured to house a plurality of frames that carry a plurality of wafers, wherein one of the plurality of frames is the frame with the frame opening, and wherein one of the plurality of wafers is the wafer that is coupled to the membrane.

Optionally, the membrane is configured to form a seal around the wafer.

Optionally, the membrane comprises an additional membrane opening, wherein the membrane is configured to couple with an additional wafer so that the additional wafer covers the additional membrane opening.

Optionally, the system is configured to process the wafer to make one or more solar cells.

Optionally, the frame comprises a plasma resistant coating.

Optionally, the system further comprises a first isolation grid disposed on a first surface of the membrane, and a second isolation grid disposed on a second surface of the membrane, wherein the second surface of the membrane is opposite from the first surface of the membrane.

Optionally, the system further comprises a vertical retention mechanism configured to maintain the frame vertically. In some cases, the vertical retention mechanism may include a magnet that interacts with another magnet at the frame.

A wafer processing method, includes: providing a frame comprising a frame opening, wherein a membrane with a membrane opening is coupled to the frame covering at least a part the frame opening, wherein a wafer is coupled to the membrane covering the membrane opening; maintaining the frame, the membrane, and the wafer vertically; forming a first I-layer over a first surface of the wafer while the wafer is oriented vertically; forming a second I-layer over a second surface of the wafer while the wafer is oriented vertically, the second surface of the wafer being opposite from the first surface; forming a N-layer over the first I-layer while the wafer is oriented vertically; and forming a P-layer over the second I-layer while the wafer is oriented vertically.

Optionally, the method further includes: forming a first conductive layer over the first surface of the wafer; and forming a second conductive layer over the second surface of the wafer.

Optionally, the first conductive layer comprises a first ITO layer, and the second conductive layer comprises a second ITO layer.

Optionally, the method further includes: forming a first conductive line over the first surface of the wafer while the wafer is coupled to the membrane, the first conductive line connecting to surfaces of the first conductive layer; and forming a second conductive line over the second surface of the wafer while the wafer is coupled to the membrane, the second conductive line connecting to surfaces of the second conductive layer.

Optionally, the first conductive line extends beyond a first edge of the wafer.

Optionally, the second conductive line extends beyond a second edge of the wafer, the second edge being opposite from the first edge of the wafer.

Optionally, the wafer, at least a part of the membrane, the first I-layer, the N-layer, the second I-layer, the P-layer, the first conductive layer, and the second conductive layer, together form a first module; and wherein the method further comprises connecting the first module and a second module to form an assembly.

Optionally, the first module and the second module are connected using an adhesive.

Optionally, the second module comprises a second wafer, a first conductive line over a first surface of the second wafer, and a second conductive line over a second surface of the second wafer, the second surface of the second wafer being opposite from the first surface of the second wafer; and wherein when the first module and the second module are connected, the first conductive line over the first surface of the first wafer is electrically connected to the second conductive line over the second surface of the second wafer.

Optionally, the method further includes: placing a first polymeric film and a second polymeric film on opposite surfaces of the assembly; and clamping the first polymeric film, the assembly, and the second polymeric film between a first glass and a second glass.

Optionally, the first module comprises a solar cell module.

Optionally, the method further includes texturing the first surface and the second surface of the wafer while the wafer is oriented vertically, wherein the act of texturing is performed before the first I-layer, the N-layer, the second I-layer, and the P-layer are formed.

Optionally, the method further includes moving the frame, the membrane, and the wafer together to a plurality of processing stations, wherein the act of moving is performed while the wafer is oriented vertically.

Optionally, the method further includes removing the membrane from the frame.

Optionally, the wafer is for making a solar module, and wherein the method further comprises coupling another membrane to the frame, and coupling another wafer to the membrane to make another solar module.

Optionally, peripheral portions of the membrane are coupled to parts of the membrane that define the membrane opening, and form a seal with the parts of the membrane that define the membrane opening.

Optionally, the membrane comprises an additional membrane opening, wherein an additional wafer is coupled to the membrane covering the additional membrane opening.

Optionally, the method further includes providing texturing treatment on opposite surfaces of the wafer. The texturing treatment may be achieved using dry etching.

Optionally, the method further includes, before the act of providing texturing treatment, coupling the membrane with a first isolation grid, wherein the first isolation grid is coupled to a first surface of the membrane.

Optionally, the method further includes coupling the membrane with a second isolation grid, wherein the second isolation grid is coupled to a second surface of the membrane, the second surface of the membrane being opposite from the first surface of the membrane.

Optionally, the first isolation grid is configured to isolate the wafer from an additional wafer that is also coupled to the membrane, wherein at least a part of the first isolation grid is located between the wafer and the additional wafer.

Optionally, the method further includes forming a first conductive layer over the N-layer, and forming a second conductive layer over the P-layer, wherein the first conductive layer extends over the wafer, across a spacing between the wafer and the additional wafer, and over the additional wafer.

Optionally, the method further includes removing the first isolation grid, wherein the removing the first isolation grid causes a part of the first conductive layer extending over the spacing between the wafer and the additional wafer to be removed, thereby electrically isolating the wafer and the additional wafer.

Optionally, the method further includes removing, using a laser device, a part of the first conductive layer that is across the spacing between the wafer and the additional wafer.

Optionally, the wafer is processed to form a first module, and the method also comprises: forming a second module using an additional wafer; and electrically coupling a conductor on a front surface of the first module with a conductor on a back surface of the second module.

Optionally, the act of electrically coupling comprises stacking a part of the second module over a part of the first module, so that the conductor on the front surface of the first module is in contact with the conductor on the back surface of the second module.

Optionally, the act of electrically coupling comprises: making a hole through a thickness of the membrane at a location that is between the wafer and the additional wafer; and forming an electrical conductor in the hole.

A solar cell assembly includes: a first module having a first substrate with a first surface and a second surface opposite the first surface, the first module also having a first conductive wire disposed over the first surface of the first substrate, and a second conductive wire disposed over the second surface of the first substrate; a second module having a second substrate with a first surface and a second surface opposite the first surface, the second module also having a first conductive wire disposed over the first surface of the second substrate, and a second conductive wire disposed over the second surface of the second substrate; and a membrane comprising a first membrane opening and a second membrane opening, wherein the first substrate and the second substrate are coupled to a first surface of the membrane, wherein the first substrate covers the first membrane opening, and wherein the second substrate covers the second membrane opening; wherein the membrane comprises a through hole at a location that is between the first substrate and the second substrate; and wherein the first conductive wire of the first module is electrically connected to the second conductive wire of the second module via a conductor located in the through hole of the membrane.

Optionally, the first module further comprises a first I-layer disposed over the first surface of the first substrate, a second I-layer disposed over the second surface of the first substrate, a N-layer disposed above the first I-layer, and a P-layer disposed over the second I-layer.

Optionally, the solar cell assembly further includes a first polymeric film and a second polymeric film, wherein the first module, the second module, and the membrane are located between the first polymeric film and the second polymeric film.

Optionally, the solar cell assembly further includes a first glass and a second glass, wherein the first polymeric film and the second polymeric film are between the first glass and the second glass.

A solar cell assembly includes: a first module having a first membrane with a first membrane opening, and a first substrate covering the first membrane opening, wherein the first substrate has a first surface and a second surface opposite the first surface, wherein the first module also has a first conductive wire disposed over the first surface of the first substrate, and a second conductive wire disposed over the second surface of the first substrate; and a second module having a second membrane with a second membrane opening, and a second substrate covering the second membrane opening, wherein the second substrate has a first surface and a second surface opposite the first surface, wherein the second module also has a first conductive wire disposed over the first surface of the second substrate, and a second conductive wire disposed over the second surface of the second substrate; wherein a part of the first conductive wire of the first module extends beyond an edge of the first substrate, and is located on the first membrane; wherein a part of the second conductive wire of the second module extends beyond an edge of the second substrate, and is located on the second membrane; and wherein a part of the second membrane overlaps a part of the first membrane, so that the first conductive wire of the first module is electrically coupled to the second conductive wire of the second module.

Optionally, the first module further comprises a first I-layer disposed over the first surface of the first substrate, a N-layer disposed above the I-layer, a second I-layer disposed over the second surface of the first substrate, and a P-layer disposed over the second I-layer.

Optionally, the solar cell assembly further includes a first polymeric film and a second polymeric film, wherein the first module, the second module, and the membrane are located between the first polymeric film and the second polymeric film.

Optionally, the solar cell assembly further includes a first glass and a second glass, wherein the first polymeric film and the second polymeric film are between the first glass and the second glass.

A manufacturing system of one or more solar cells comprises a transport cavity, wherein a longitudinal-shaped transport track is arranged in the transport cavity and is provided with a first side and a second side located on two sides of the transport track; wherein a movable frame (carrier) can be vertically transmitted along the transport track and is provided with a frame window; wherein a membrane (e.g., an adhesive film) is adhered to the movable frame and has a plurality of film windows, the frame window exposing the plurality of film windows, each film window exposing a corresponding substrate that is attached to the membrane.

Optionally, the manufacturing system also includes a front film station having a first electrode located on a first side of the transport track, and a second electrode is located on a second side of the transport track, the first electrode and the second electrode configured to move towards the transport track to form a closed space accommodating the substrate.

Optionally, the front film station is configured to form a front film layer on a front surface of the substrate.

Optionally, the manufacturing system also includes a back film station having a first electrode located on the second side of the transport track, and a second electrode located on the first side of the transport track, the first electrode of the back film station and the second electrode of the back film station configured to move towards the transport track to form a closed space accommodating the substrate.

Optionally, the back film station is configured to form a back film layer on a back surface of the substrate.

Optionally the front film station is configured to form the front film layer before the back film station forms the back film layer.

Optionally the back film station is configured to form the back film layer before the front film station forms the front film layer.

Optionally, the manufacturing system further comprises a preparation station and a texturing station, wherein the preparation station and the texturing station are both arranged before the front film station and the back film station, and the texturing station is configured to provide texturing treatment on the front surface and the back surface of the substrate.

Optionally, the manufacturing system further comprises a magnetron sputtering station configured to process the substrate after the substrate is processed by the front film station and the back film station.

Optionally, the magnetron sputtering station comprises a first magnetron sputtering device and a second magnetron sputtering device.

Optionally, the first magnetron sputtering device is configured to face the front surface of the substrate, and is configured to form a front conductive layer on the front surface of the substrate.

Optionally, the second magnetron sputtering device is configured to face a back surface of the substrate, and is configured to form a back conductive layer on the back surface of the substrate.

Optionally, the manufacturing system further comprises an isolation grid station configure for arranging isolation grid devices respectively on the front surface and the back surface of the membrane between adjacent substrates.

Optionally, the manufacturing system further comprises a texturing station, wherein the texturing station is located before a preparation station, and the isolation grid station is arranged between the texturing station and the preparation station.

Optionally, the manufacturing system comprises a texturing station configured to provide texturing treatment on the substrate.

Optionally, the texturing station comprises a dry etching device.

Optionally, the texturing station is located between a preparation station and the front/back film station.

Optionally, the material of the isolation grid device comprises a conductor material and/or an adhesive tape material.

Optionally, the manufacturing system further comprises a punching station configured to form a through hole through the membrane between adjacent substrates.

Optionally, the manufacturing system further comprises a bus bar connection station located behind the punching station, the bus bar connection station configured to form an electrical conductor in the through hole (and optionally also on the front side and the back surface of the substrate), so that a conductive wire (bus bar) on the front surface of one substrate is electrically connected with a conductive wire (bus bar) on the back surface of an adjacent substrate.

Optionally, the manufacturing system further comprises a laser device configured to remove a part of the front conductive layer and a part of the back conductive layer that are between adjacent substrates.

Optionally, the manufacturing system further comprises a loading station located behind a preparation station, and before the front film station and the back film station.

Optionally, the manufacturing system further comprises a buffer cavity located behind the front film station and the back film station, and before the magnetron sputtering station.

Optionally, the manufacturing system further comprises a preheating station located behind a texturing station, and located before the front film station and the back film station.

Optionally, the manufacturing system further comprises an unloading station located behind a magnetron sputtering station and before a punching station.

Optionally, the membrane comprises polyimide, polyester or polypropylene.

Optionally, only a part of the membrane around the membrane window has an adhesive property.

Optionally, the membrane comprises two planar pieces, one or each of the planar pieces has an adhesive surface, wherein the planar pieces are attached to each other via at last a part of the adhesive surface(s), wherein the membrane window of one of the two planar pieces is in one-to-one correspondence with the membrane window of the other one of the two planar pieces.

Optionally, the substrate is clamped between respective parts of the two planar pieces of the membrane.

A manufacturing method of one or more solar cells performed by a manufacturing system, the method comprising: providing a plurality of substrates comprising a first substrate, the first substrate is adhered to a membrane (e.g., an adhesive film), wherein a membrane window on the membrane exposes a part of the first substrate; attaching the membrane to a movable frame; and transporting the frame in a transport cavity along a transport track.

Optionally, the frame is transported to a first position at which opposite surfaces of the first substrate respectively face a first electrode and a second electrode of a front film station, the opposite surfaces comprise a front surface and a back surface; wherein the method further comprises moving the first and second electrodes towards the frame to form a closed space accommodating the first substrate; and forming a front film layer on the front surface of the first substrate.

Optionally, the method further includes: transporting the frame to a second position at which the opposite surfaces of the first substrate respectively face a first electrode and a second electrode of a back film station; moving the first and second electrodes of the back film station towards the frame to form a closed space accommodating the first substrate; and forming a back film layer on the back surface of the first substrate.

Optionally, prior to forming the front film layer or the back film layer, the method further comprises texturing the front side and the back surface of the first substrate.

Optionally, after the front film layer and the back film layer is formed, the method further comprises forming a front conductive layer on the front film layer; and forming a back conductive layer on the back film layer.

Optionally, before the front conductive layer and the back conductive layer are formed, the front and back surfaces of the membrane are respectively provided with isolation grid devices.

Optionally, at least a part of the front conductive layer extends over a gap between the first substrate and a second substrate, and the method further comprise removing the part of the front conductive layer.

Optionally, at least a part of the back conductive layer extends over a gap between the first and second substrates, and the method further comprise removing the part of the back conductive layer.

Optionally, the part of the front conductive layer and/or the part of the back conductive layer are removed by removing isolation grid device(s) from the membrane.

Optionally, the part of the front conductive layer and/or the part of the back conductive layer are removed using laser.

Optionally, after the part of the front conductive layer between the first and second substrates is removed, and after the part of the back conductive layer between adjacent substrates is removed, the method further comprises forming a through hole penetrating the membrane between the first and second substrates.

Optionally, the first and second substrates are both connected to the membrane, and the method further comprises forming an electrical conductor in the through hole to connect a first bus bar at a front surface of the first substrate to a second bus bar at a back surface of the second substrate.

Optionally, the method further includes cutting a first portion of the membrane containing the first substrate away from a second portion of the membrane that is attached to the frame.

Optionally, the method further comprises: removing a remaining portion of the membrane that is coupled to the frame; and after the remaining portion of the membrane is removed from the frame, reattaching a new membrane to the frame for the manufacture of a next solar cell.

A solar cell assembly comprises at least one substrate unit, wherein the substrate unit comprises a plurality of substrates which are connected together through an adhesive film, the plurality of substrates comprising a first substrate and a second substrate, the front surface of each of the substrates is provided with a front film layer, the back surface of each of the substrates is provided with a back film layer, the adhesive film is provided with a plurality of substrate windows corresponding with the respective substrates, each substrate window exposing at least a part of the corresponding substrate, the adhesive film between adjacent substrates is provided with a through hole penetrating through the adhesive film, the surface of the front film layer is provided with a conductive wire, and the surface of the back film layer is provided with another conductive wire, wherein the front surface of the first substrate is electrically connected with the back surface of the second substrate.

Optionally, a front conductive layer is arranged between the front film layer and the conductive line associated with the front film layer; and a back conductive layer is arranged between the back film layer and the other conductive line associated with the back film layer.

Optionally, the thickness of the substrate is anywhere from 50 microns to 1.5 mm.

Optionally, solar cell assembly further comprises a first plastic sealing layer, and a second plastic sealing layer.

A manufacturing system includes a movable frame for manufacturing solar cell, and a conveying mechanism, wherein the frame comprises a frame opening, the frame around the frame opening is configured for coupling with a membrane (e.g., an adhesive film), the membrane comprising a plurality of membrane windows, wherein each membrane window is configured to expose a corresponding one of the substrates.

Optionally, the material of the bearing frame comprises an aluminum alloy, stainless steel, a carbon composite material, or titanium.

Optionally, the surface of the carrier frame comprises a plasma resistant coating.

Optionally, the manufacturing system further comprises a detachable mechanism which is configured for detachably connecting the frame with a first isolation grid device on one side of the membrane.

Optionally, the detachable mechanism is also configured to detachably connect the frame with a second isolation grid device on another opposite side of the membrane.

Optionally, the manufacturing system further includes a transport mechanism.

Optionally, the transport mechanism comprises a pulley, a conveyor belt or a magnetic suspension mechanism.

Optionally, the manufacturing system further comprises a vertical holding mechanism for keeping the frame perpendicularly.

Optionally, the top of the vertical holding mechanism comprises a magnet.

Optionally, and the vertical holding mechanism at the top of the movable frame has a first magnet, a concave magnetic shielding piece is arranged on the inner side wall of the top of the transport cavity, the concave shape faces the movable frame, the top of the movable frame can be transmitted in the groove, a second magnet is arranged on the inner side wall opposite to the groove, the second magnet is opposite to the first magnet, and the opposite second magnet is the same as that of the first magnet, and a gap is formed between the top of the movable frame and the bottom of the groove.

A solar cell comprises a plurality of substrates are connected together through a membrane (e.g., an adhesive film), so that the plurality of substrates can be formed and/or processed together at one time without strictly controlling the shape and the position of the conductive lines individually on each substrate, and the electric connection between the front side of one substrate and the back surface of an adjacent substrate can be better achieved.

Other features will be described in the detailed description.

BRIEF DESCRIPTION OF THE DRAWINGS

The above and other features and advantages will become readily apparent to those skilled in the art by the following detailed description of exemplary embodiments thereof with reference to the attached drawings, in which:

FIG. 15A illustrates a module having a membrane with multiple wafers coupled thereto.

FIG. 15B illustrates two modules being coupled together to form an assembly.

DETAILED DESCRIPTION

Figure 1A:
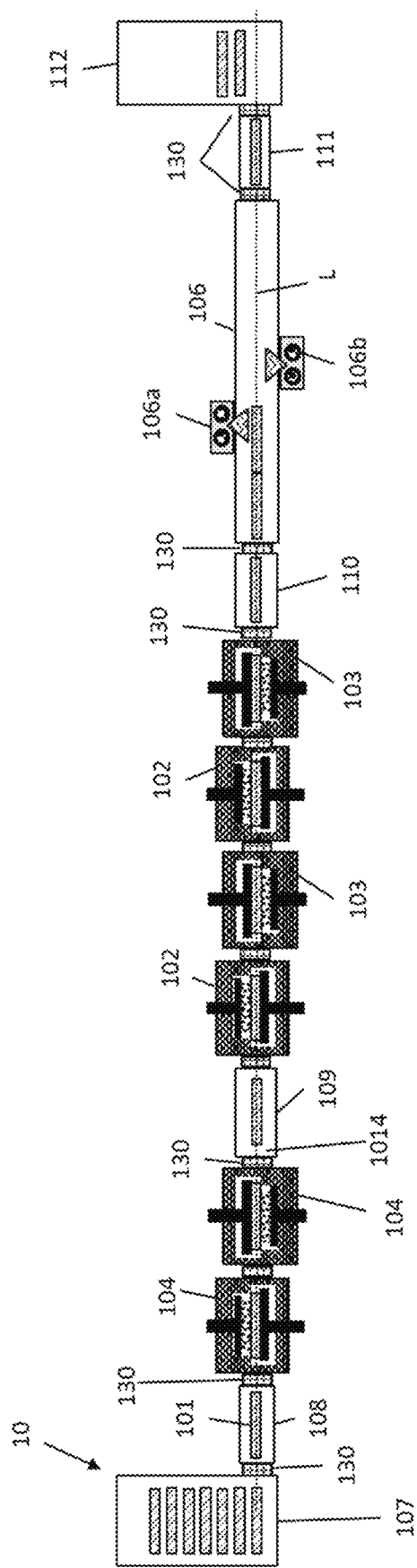
FIG. 1A illustrates a system for wafer processing.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

According to the technical scheme, a manufacturing system and a transport cavity of the solar cell are provided with a longitudinal-shaped transport track, and the transport cavity is provided with a first side and a second side located on two sides of the transport track. A membrane (e.g., adhesive film) is adhered to a movable frame and has a plurality of membrane windows (membrane openings). The frame has a frame window exposing at least a part of the membrane and the membrane windows. Each membrane window is configured to expose a corresponding substrate. The manufacturing system has a front film station for forming a front film layer on a front surface of the substrate, and a back film station for forming a back film layer on the back surface of the substrate. The solar cell manufacturing system is small in occupied area and beneficial to saving cost.

In order to make the above objects, features and beneficial effects of the present invention more comprehensible, specific embodiments of the invention are described in detail below with reference to the accompanying drawings.

Manufacturing System and Method

FIG. 1A illustrates a manufacturing system 10 for making one or more solar cells. As shown in the figure, the solar cell manufacturing system 10 is provided for forming one or more heterojunction solar cells, and includes a preparation station 107, a loading station 108, texturing station 104, two front film stations 102 (each having a front PECVD chamber), two back film stations 103 (each having a back PECVD chamber) and a magnetron sputtering station 106 (having a first magnetron sputtering device 106a and a second magnetron sputtering device 106b). The manufacturing system 10 also includes a slit valve 130 configured to interface between atmospheric pressure and vacuum involved in the different processes carried out by the manufacturing system 10.

The preparation station 107, the loading station 108, the texturing station 104, the front film stations 102, the back film stations 103, and the magnetron sputtering device 106 are configured to cooperate with each other spatially and temporally. This obviates the need to have a separate film guide machine to achieve spatial and temporal matching between processing stations, and the manufacturing system of the solar cell is relatively simple and small in occupied area. Moreover, because the wafer does not need to be transferred in and out of any film guide machine using a manipulator, the wafer is less prone to particles.

The texturing station 104 is configured for texturing the front surface and the back surface of the wafer, so as to form texturing on the front surface (e.g., first surface) and the back surface (e.g., second surface) of the wafer (substrate). The front film stations 102 are configured for forming a front film layer on the front surface of the wafer, wherein the front film layer comprises a front intrinsic layer and a front doping layer located on the front intrinsic layer. The back film stations 103 are configured for forming a back film layer on the back surface of the wafer (substrate), wherein the back film layer comprises a back intrinsic layer and a back doping layer located on the back intrinsic layer. The magnetron sputtering station 106 is configured for forming a front conductive layer and a back conductive layer on the front side and the back side of the wafer (substrate), respectively. Each conductive layer may be an ITO layer in some embodiments. In other embodiments, each conductive layer may be made from other materials.

As shown in FIG. 1A, after the front film stations 102 and the back film stations 103, the manufacturing system 10 of the solar cell further comprises a buffer cavity 110 and a magnetron sputtering station 106 after the buffer cavity 110. The pressure in the magnetron sputtering station 106 may be different from the pressure in a cavity of the front film station 102 or the pressure in a cavity of the back film station 103. The buffer cavity 110 is configured for enabling the pressure in the buffer cavity 110 to reach the pressure in the magnetron sputtering station 106.

The material of the front intrinsic layer and the back intrinsic layer comprises amorphous silicon (A-Si:H). In some cases, each of the front and back intrinsic layers may include one layer or multiple (e.g., 2, 3, etc.) layers of a-Si:H. The material of the front doping layer may be amorphous silicon or microcrystalline silicon of a stacked layer, or both, doped with N-type ions. The material of the back doping layer is amorphous silicon doped with P-type ions. In some cases, the front doped intrinsic layer may be Phosphorus doped intrinsic layer, and the back doped intrinsic layer may Boron doped intrinsic layer. In such cases, the N-layer may be formed using Phosphorus, and the P-layer may be formed using Boron. The material of the front conducting layer and the back conducting layer is transparent conductive oxide. In other embodiments, other materials may be used for the different layers.

In some cases, the N-layer and the P-layer may be made of microcrystalline silicon. In addition, in some embodiments, any, some, or all of the layers (I-layers, N-layer, P-layer) may be made up of multiple layers of deposition of similar material deposited in different processing conditions to enhance the conversion efficiency of the solar cell.

The manufacturing system 10 of the solar cell further comprises a transport path 100. In some cases, the transport path 100 may include a track, a rail, a guide, a transport surface, etc., extend along one or more transport cavities, which provide a vacuum environment. An elongated rail L is arranged in the transport cavity 1014. The rail L is configured for allowing a frame 101 to move there-along to thereby place the frame 101 at different processing stations for processing wafers carried by the frame 101.

Figure 1B:
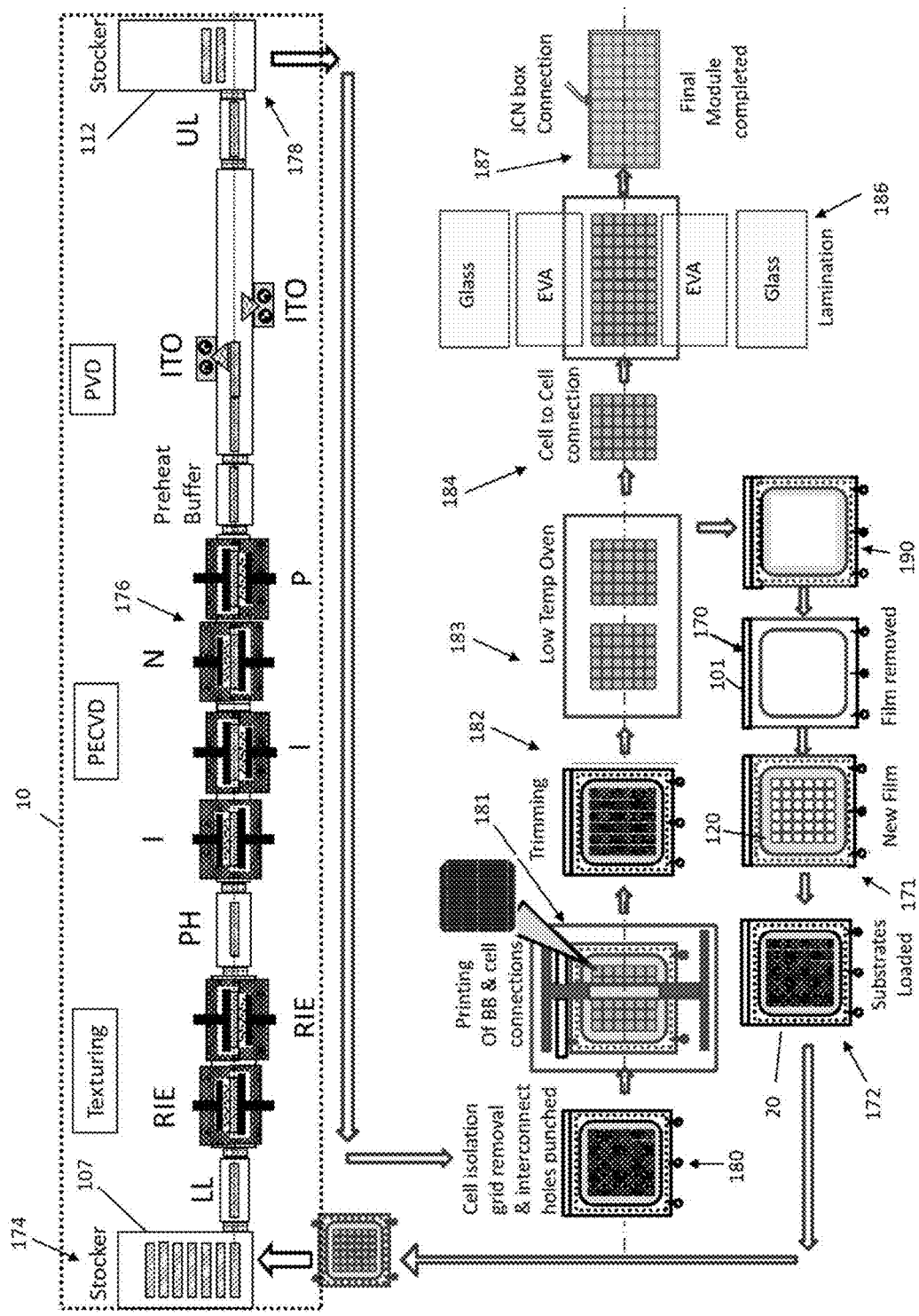
FIG. 1B illustrates additional processing after the processing done by the system of FIG. 1A.

As shown in FIG. 1B, during use, the frame 101 with a frame opening is provided (item 170). Then a membrane 120 with membrane openings is coupled to the frame 101 (item 171). When the membrane 120 is coupled to the frame 101, the membrane 120 covers at least a part of the frame opening, thereby allowing the frame opening to expose the membrane 120 and the membrane openings. Next, multiple wafers 20 (substrates) are coupled to the membrane 120, so that the wafers respectively cover the membrane openings (item 172). In other embodiments, the wafers may be coupled to the membrane 120 first, and then the membrane 120 may be coupled to the frame 101. When the membrane 120 is coupled to the frame 101, the membrane 120 is under tension (e.g., in at least two orthogonal directions).

Next, the frame 101 with the membrane 120 and the wafers 20 are inserted into the preparation station 107 (item 174). The manufacturing system 10 then transports the frame 101 (together with the membrane 120 and wafers 20) to different stations sequentially to dispose solar cell components onto the wafers (item 176). The processing of the wafers 20 by the manufacturing system 10 in item 176 will be described in detail with reference to FIG. 1A. The processed wafers (modules) are then provided to the storage station 112 (item 178), as shown in FIG. 1B.

Next, the processed wafers are retrieved from the storage station 112 (item 180). In some embodiments, interconnect holes are then punched through the membrane 120 at locations between the processed wafers. Also, in some embodiments, if isolation grid device(s) was provided to isolate the processed wafers (substrates) or group of wafers from each other during processing by the manufacturing system 10, the isolation grid device(s) may also be removed during item 180. The isolation grid device may be configured to be disposed on the membrane 120 at locations between processed wafers. Accordingly, when a layer is formed onto the substrates by the manufacturing system 10, part of the layer may be formed on a surface of the substrate, extending onto the isolation grid device that is disposed between the substrate and an adjacent substrate, and extending onto a surface of the adjacent substrate. When the isolation grid device is later removed, a part of the layer that is on the isolation grid device will also be removed correspondingly, thereby breaking up the formed layer into individual layer portions for the respective substrates. Removal of the isolation grid device will also expose the membrane 120 at the locations between the processed wafers, allowing the membrane 120 at those locations to be punched through to implement the interconnect holes.

Next, electrical conductors (conductive wires, such as bus bars) are then disposed on the processed wafers (item 181). In the illustrated embodiments, bus bars and cell connections are formed on the processed wafers. The bus bars may be formed using printing technique in some embodiments. Also, in some embodiments, a set of front bus bars may be formed on a front surface of each processed wafers (substrates), and a set of back bus bars may be formed on a back surface of each processed wafers (substrates). The bus bars are formed to connect ITO surfaces at the processed wafers, and in the final product, these bus bars are configured to collect electrons from the ITO surfaces. In some embodiments, the bus bars may be made of silver or silver coated copper wires or strips. In another embodiment, the bus bars may be made of copper plating. In further embodiments, the bus bars may be made from other materials. In item 181, electrical conductors may also be formed in the interconnect holes described with reference to item 180, thereby connecting a front bus bar of a substrate to a back bus bar of an adjacent substrate (like that shown in FIG. 17, which will be described in further detail below).

Next, the processed wafers (modules) are removed from the frame 101 (item 182). In some embodiments, the removal of the modules from the frame 101 may be achieved by cutting the membrane 120, so that a first part of the membrane 120 to which the modules are attached can be removed from the frame 101, while leaving behind a second part of the membrane 120 that is coupled to the frame 101 (item 190). The second part of the membrane 120 may be removed from the frame 101 to allow the frame 101 to be re-used (for another membrane and other wafers) (item 170).

Next, the modules that are connected to the cut-out membrane 120 are placed in an oven and are heat treated (item 183). This heat treatment is to harden the silver paste that may be used to form the bus bar (in item 181). In some cases, a solvent may be added to make the silver pliable for bus bars forming (e.g., via screen printing), and the applied heat is for evaporating the solvent. In some cases, there may be multiple frames 101 with multiple respective membranes 120 for processing by the manufacturing system 10. In such cases, multiple cut-out membranes 120 (with respective sets of modules) may be heat treated together.

Next, the heat treated sets of modules (coupled to respective cut-out membranes 120) are connected to each other to form an assembly (item 184). For example, a first set of modules on a first cut-out membrane 120 may be connected to a second set of modules on a second cut-out membrane 120. In some embodiments, an outer side portion of the second cut-out membrane may overlap an outer side portion of the first cut-out membrane to form an electrical connection between the first and second sets of modules (like that shown in FIGS. 15B-15C, which will be described in further detail). This overlapping technique allows top bus bars at a top surface of one module to be electrically connected, via the overlapping region, to bottom bus bars at a bottom surface of an adjacent module.

Next, polymeric layers (e.g., EVA layers) are then disposed on opposite sides of the assembly, and glasses are disposed on opposite sides containing the polymeric layers and the assembly, forming a completed solar panel assembly (item 186). The completed solar panel assembly is then connected to a junction box (item 187). The junction box is configured to collect and to output DC voltage of the entire solar panel assembly. The solar cells in the solar panel assembly connect to each other along a first direction of the solar panel assembly in series. Horizontal bus bars collect the outputs of the respective columns, and form parrel connections. The DC voltage provisioned by both sides of the solar cells in the solar panel assembly are collected at the junction box, via the parallel connections and the series connections.

In some embodiments, the features described with reference to item 170, item 171, item 172, item 180, item 181, item 182, item 183, item 184, item 186, item 187, or any combination of the foregoing, may be performed automatically by processing stations, which may or may not be considered to be a part of the manufacturing system 10. For example, the manufacturing system 10 may optionally include a frame handling station to provide the frame 101 (described with reference to item 170), a membrane installation station configured to couple the membrane 120 to the frame 101 (described with reference to item 171), a wafer installation station configured to couple the wafers to the membrane 120 (described with reference to item 172), an isolation grid removal station configured to remove one or more isolation grid devices from the frame 101 and/or from the membrane 120 (described with reference to item 180), a hole-punching (or punching) station configured to create through-holes on the membrane 120 (described with reference to item 180), a bus bar printing station configured to form bus bars on opposite sides of the wafers, and a bus bar connection station configured to form electrical conductors to connect bus bars from one side of the wafer to bus bars from opposite side of adjacent wafer (described with reference to item 181), a trimming station configured to remove a part of the membrane 120 containing the processed wafers (described with reference to item 182), a heating station for heat treating the processed wafers 20 (described with reference to item 183), an assembly station configured to connect multiple processed wafers (substrates) 20 to form an assembly (described with reference to item 184), a packaging station configured to provide polymeric layers and glasses on opposite sides of the assembly (described with reference to item 186), a membrane removal station configured to remove a remaining part of the membrane 120 from the frame 101 (described with reference to items 170, 190), or any combination of the foregoing.

In some embodiments, any of the processing stations described herein may include mechanical component(s), electrical component(s), electrical-mechanical component(s), or any combination thereof, configured to provide the features described herein. Also, in some embodiments, any of the processing stations described herein may optionally include a control component, a feedback component (e.g., one or more sensors), or any of other mechanical and/or electrical components.

The processing of the wafers in item 176 by the manufacturing system 10 will now be described with reference to FIG. 1A. First, the frame 101 carrying the wafers 20 is transported from the preparation chamber 107 to a loading chamber (LL) 108. The loading chamber 108 is configured to transport the wafers 20 from an atmospheric environment to a vacuum environment. The frame 101 carrying the wafers 20 is then transported from the loading chamber 108 to the texturing station 104. The texturing station 104 includes a front texturing station 104a and a back texturing station 104b. The front texturing station 104a is configured for texturing the front surfaces of the wafers 20, and the back texturing station 104b is configured for texturing treatment the back surfaces of the wafers 20. In some embodiments, each of the texturing stations 104a, 104b may be an inductively coupled plasma etching device. In other embodiments, each of the texturing stations 104a, 104b may be a capacitively coupled plasma etching device. Also, in some embodiments, each texturing stations 104a, 104b may include a cavity in which texturing may be performed on the wafers 20. The texturing process performed by the texturing station 104 is to roughen the opposite surfaces of each wafer 20 to reduce reflection of the surfaces of the wafer 20 so that more photons can be absorbed by the wafer 20.

In the illustrated example, the surfaces of the wafers 20 are textured by dry etching in the texturing station 104, so that the texturing degree is relatively easy to control, and the texturing is not too deep. Accordingly, the wafers 20 do not need to be thicker (compared to the wet etching technique). In other words, the wafers 20 with the thinner thickness can be used to form the solar cell(s) due to the dry etching technique being employed. Since the thickness of the wafers is relatively thin, the cost of the wafers is reduced. In the embodiment, the thickness of the wafers (substrates) may be anywhere from 50 to 180 microns. In some embodiments, the dry etching may be accomplished using reactive ion etching (RIE).

Using dry etching in the same vacuum environment before PECVD deposition is advantageous. This is because there is no oxidation of the silicon surface and therefore covering the exposed silicon surface may not be as urgent as that in current processing sequence. In current processing sequence, silicon surfaces after wet etch have que time requirements to complete the PECVD deposition over bare silicon surfaces to prevent oxidation.

In the illustrated example, after the wafers 20 carried by the frame 101 are processed by the texture station 104, the frame 101 carrying the wafers 20 is transported into the preheating station 109 before entering the first front film station 102. Because the temperature in the first front film station 102 is different from the temperature in the texturing station 104, the preheating station 109 is configured for preheating the wafers 20 to a certain temperature before being processed by the first front film station 102. By means of non-limiting examples, the preheating station 109 may be configured to preheat the wafers 20 to a temperature that is higher than 100 degree Celsius, higher than 150 degree Celsius, etc. During processing by the film station 102, the temperature may reach higher than the preheat temperature.

The first front film station 102 (e.g., the left most film station 102 in FIG. 1A) is configured to dispose an I-layer over (e.g., onto) the front surfaces of the wafers 20, and the first back film station 103 (e.g., the left most film station 103 in FIG. 1A) is configured to dispose an I-layer over (e.g., onto) the back surfaces of the wafers 20. Also, the second front film station 102 is configured to dispose a N-layer over the front surfaces of the wafers 20, and the second back film station 103 is configured to dispose a P-layer over the back surfaces of the wafers 20. In some cases, each of the front and back film stations 102, 103 may be configured to perform PECVD to respectively create the I-layers, the N-layer, and the P-layer onto the wafers 20. In one implementation PECVD deposition may be performed to form the I-layers, N-layer, and the P-layer. By orienting the wafers 20 vertically, separate stations may sequentially deposit respective materials onto opposite surfaces of the wafers 20 from opposite sides of the transport path 100. This technique is advantageous because it prevents dopant chemicals on one side of the wafer from contaminating the other side of the wafer.

In other embodiments, the two front film stations 102 may be configured to process the front surfaces of the wafers, and then the two back film stations 102 then process the back surfaces of the wafers. For example, the first front film station 102 may form an I-layer over the front surfaces of the wafers 20, and then the second front film station 102 may form a N-layer over the front surfaces of the wafers 20. Next the first back film station 103 may form an I-layer over the back surfaces of the wafers 20, and then the second back film station 103 may form a P-layer over the back surfaces of the wafers 20.

In some embodiments, the front film station 102 may have two sub-stations for respectively forming a first I-layer and a N-layer. In such cases, the manufacturing system 10 may not include the second front film station 102. Also, the back film station 103 may have two sub-stations for respectively forming a second I-layer and a P-layer. In such cases, the manufacturing system 10 may not include the second back film station 103. Also, in some embodiments the sub-stations may be arranged to form the first I-layer first, and then the second I-layer, followed by forming the N-layer, and the P-layer. In other embodiments, the sub-stations may be arranged to form the layers in other order. For example, in other embodiments, the sub-stations may be arranged to form the first I-layer first, and then the N-layer, followed by forming the second I-layer, and then the P-layer. In other embodiments, the manufacturing system 10 may include additional film station(s) or sub-station(s) to form additional layer(s) over the front surface and/or additional layer(s) over the back surface of the wafers 20.

In the illustrated embodiments, the frame 101 carrying the wafers 20 first enters the first front film station 102, and then it enters the first back film station 103, in other embodiments, the frame 101 first enters the first back film station 103, and then it enters the first front film station 102.

As shown in FIG. 1A, after being processed by the front film stations 102 and the back film stations 103, the wafers 20 carried by the frame 101 is transported to the buffer cavity 110 before being processed by the magnetron sputtering station 106. The pressure in the magnetron sputtering station 106 may be different from the pressure in a cavity of the front film station 102 or the pressure in a cavity of the back film station 103. The buffer cavity 110 is configured for (1) enabling the pressure in the buffer cavity 110 to reach the pressure in the magnetron sputtering station 106, and/or (2) heating the wafers 20. For example, in some embodiments, the buffer cavity 110 may provide a buffer for different pressure between PECVD processing and PVD processing. Alternatively or additionally, the buffer cavity 110 may including a wafer heating mechanism configure to heat the wafer to maintain the wafers 20 at a certain temperature in the buffer cavity 110. In some cases, the heating mechanism may be configured to maintain the temperature in the buffer cavity 110 at 100 C, which is lower than the temperature associated with the PECVD processing (e.g., anywhere from 200 C to 250 C).

The magnetron sputtering station 106 includes a first magnetron sputtering device 106a and a second magnetron sputtering device 106b. The first magnetron sputtering device 106a is configured to deposit material(s) onto first surfaces of the respective processed wafers 20 to create a first conductive layer (e.g., a front conductive layer or a back conductive layer). Similarly, the second magnetron sputtering device 106b is configured to deposit material(s) onto second surfaces (opposite from the respective first surfaces) of the respective processed wafers 20 to create a second conductive layer (e.g., a front conductive layer or a back conductive layer). In some cases, each of the magnetron sputtering devices 106a, 106b may be configured to perform physical vapor deposition (PVD) to create the conductive layers. In other cases, each of the magnetron sputtering devices 106a, 106b may be configured to perform physical vapor deposition (PVD). In some embodiments, each conductive layer may be an ITO layer/film. The ITO layer may comprise of indium, tin and oxygen, and may be optically transparent.

With continued reference to FIG. 1A, after being processed by the magnetron sputtering station 106, the frame 101 carrying the wafers 20 is then transported to the unloading chamber 111 for transitioning the substrate from a vacuum environment to an atmospheric environment. The frame 101 is then transported from the unloading chamber 111 to the storage station 112, which stores the frame 101 with the processed wafers 20.

While the frame 101 carrying the wafers 20 is being transported along the transport path 100, the frame 101 is oriented vertically (e.g., a normal of the plane of the frame 101/wafer is approximately parallel to a floor, wherein "approximately parallel" refers to an angle that is 0 degree+/−10 degrees). Thus, the wafers 20 are processed by the texturing station 104, the front film stations 102, the back film stations 103, and the sputtering station 106 while the wafers 20 are oriented vertically. This feature is advantageous because it allows the transport path 100 to occupy a much smaller area (compared to a horizontal system in which the wafers are processed horizontally). Also, orienting the wafer vertically allows the texturing station 10 to carry out texturing treatment on opposite surfaces of the wafer without the aid of a rotating tool (which occupies a large area resulting in relatively high cost) to achieve processing of different surfaces.

In the manufacturing system 10, the processing of the wafers 20 does not require flipping of the wafers. This is because the wafers 20 are oriented vertically while being processed by the manufacturing system 10. In particular, the manufacturing system 10 has various processing stations arranged on opposite sides of the transport path 100, which allows both opposite surfaces of the vertically oriented wafer 20 to be processed from the opposite sides of the transport path 100. Accordingly, the wafers 20 do not need to be flipped during the manufacturing process.

Wafer-Carrying Frame

Figure 2:
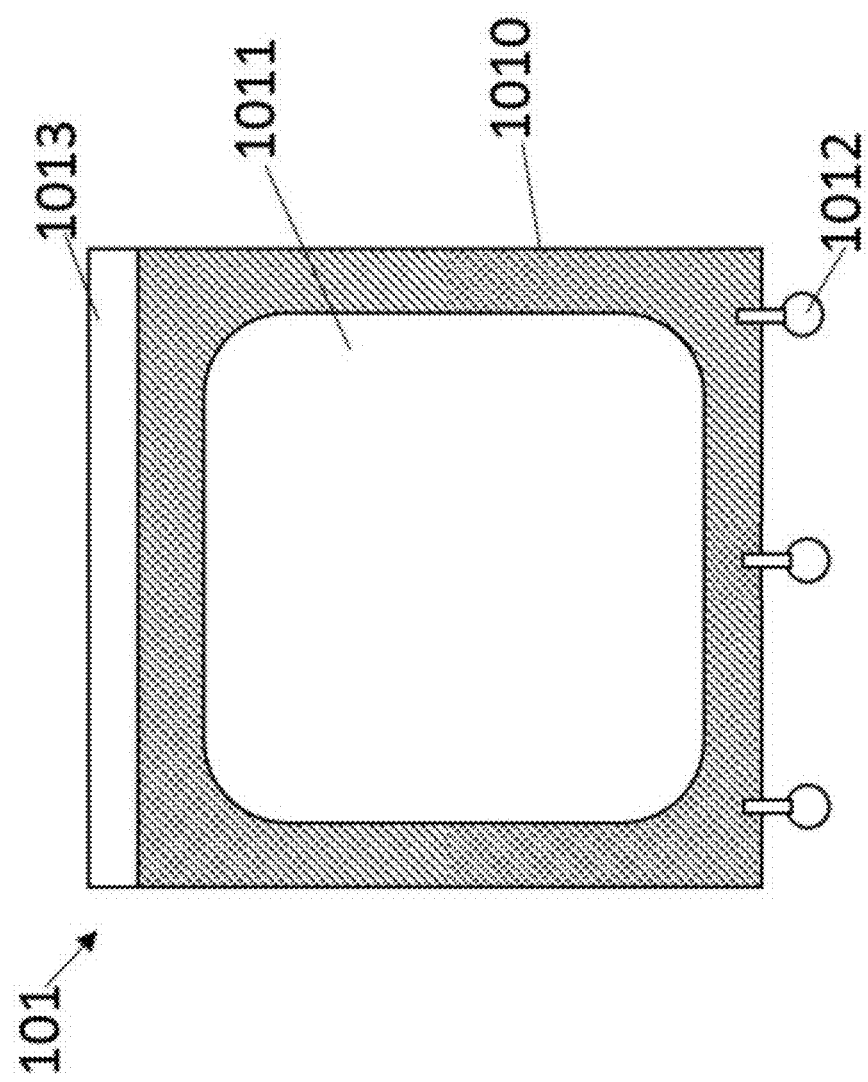
FIG. 2 illustrates a frame configured for use with the system of FIG. 1A.

FIG. 2 illustrates the frame 101 in further detail. As shown in the figure, the frame 101 includes a perimeter portion 1010 defining a frame opening 1011, and a transport mechanism 1012 for enabling the frame 1010 to move along a predetermined track. By means of non-limiting examples, the transport mechanism 1012 may be one or more wheels (e.g., three wheels or more), one or more rollers, one or more bearings, one or more glider, one or more mechanical interfaces configured to couple with a rail or belt, etc.

In some embodiments, the transport mechanism 1012 may be arranged at the bottom of the frame 101. In other embodiments, the transport mechanism 1012 may be arranged at a side of the frame 101, or at a top of the frame 101. In other embodiments, the transport mechanism 1012 may also be provided at other locations.

By means of non-limiting examples, the material of the frame 101 may comprise an aluminum alloy, stainless steel, a carbon composite material, titanium, a polymer, or any other metal or alloy. The surface of the frame 1010 may be coated with a plasma resistant coating, and the plasma resistant coating protects the bearing frame 1010 from plasma corrosion.

Figure 3:
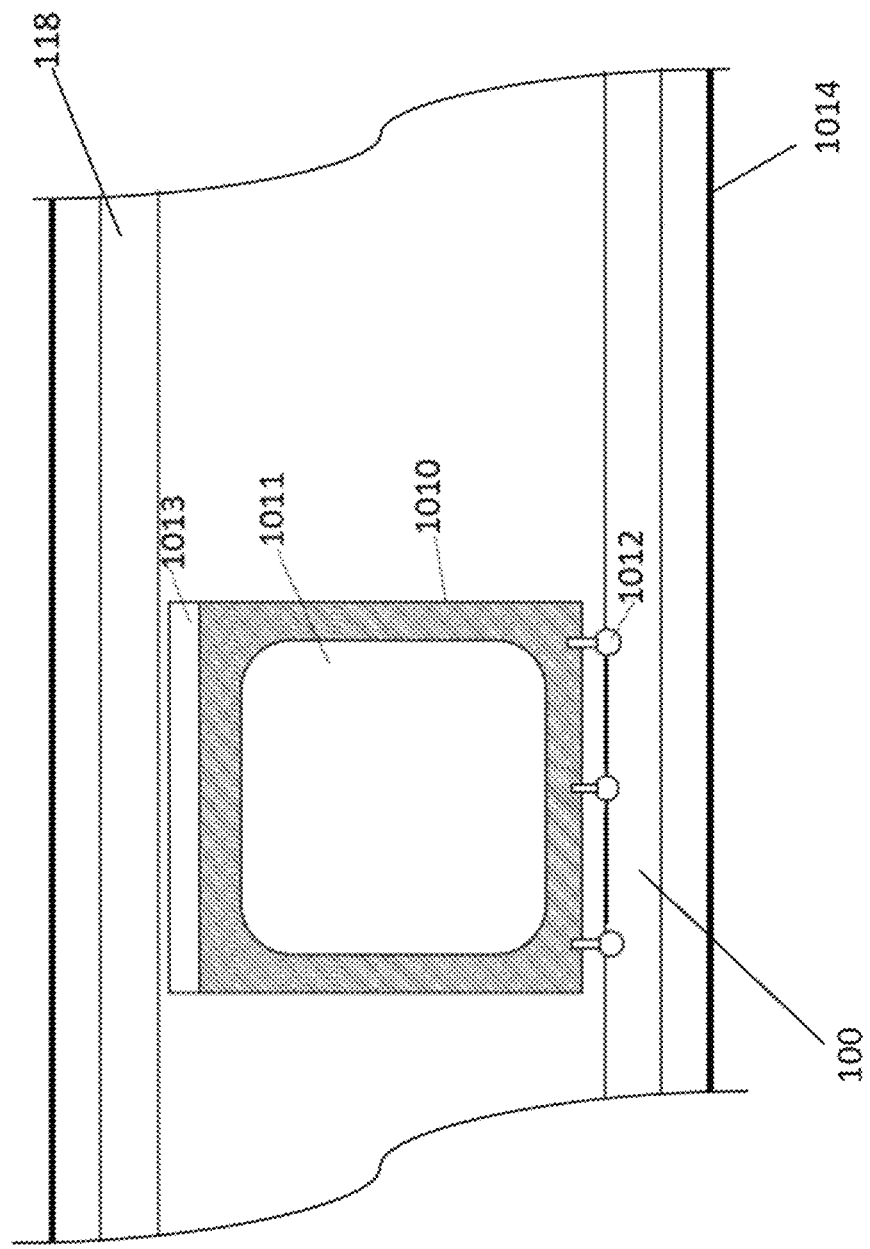
FIG. 3 illustrates the frame of FIG. 2, particularly showing the frame being moveably coupled to a transport mechanism.

Referring to FIG. 3, the transport mechanism 1012 enables the frame 101 to be transported along the transport path 100, so that the frame 101 (with the membrane 120 and wafers 20) can be placed in different stations of the manufacturing system 10, as discussed with reference to FIG. 2. The frame 101, which functions a carrier, is transported along the transport path 100 while oriented in a vertical orientation. Since the wafers 20 and the membrane 120 are coupled to the frame 101 (with the major surfaces of the wafers 20 and the major surface of the membrane 120 being parallel to the plane of the frame 101), the wafers 20 are also oriented vertically during processing by the manufacturing system 10 due to the vertical orientation of the frame 101. This configuration is advantageous because the occupied area (footprint) of the frame 101 is small. In particular, the footprint occupied by the vertically-oriented frame 101 is approximately L×t, where L is the length of the frame 101, and t is the thickness of the frame 101. This footprint area is much less than a planar area occupied by the frame 101 if the frame 101 is oriented horizontally (in which case, the footprint area will be L×L). Thus, the transport mechanism in the manufacturing system 10 occupies much less area (compared to a horizontal system in which the wafers are processed horizontally), and the manufacturing cost is reduced.

In some embodiments, the transport path 100 may include a pulley configured to detachably and mechanically couple to the transport mechanism 1012. In other embodiments, the transport path 100 may include a belt or a magnetic suspension mechanism configured to interface with the transport mechanism 1012. In further embodiments, the transport path 100 may simply provide a surface for allowing the transport mechanism 1012 to move thereon. Also, in some embodiments, the transport path 100 may include a track, and the transport mechanism 1012 and the track may be implemented using a tongue-and-groove mechanism, or any mechanical coupler that allows the frame 101 to moveably and detachably couple to the track.

Figure 4:
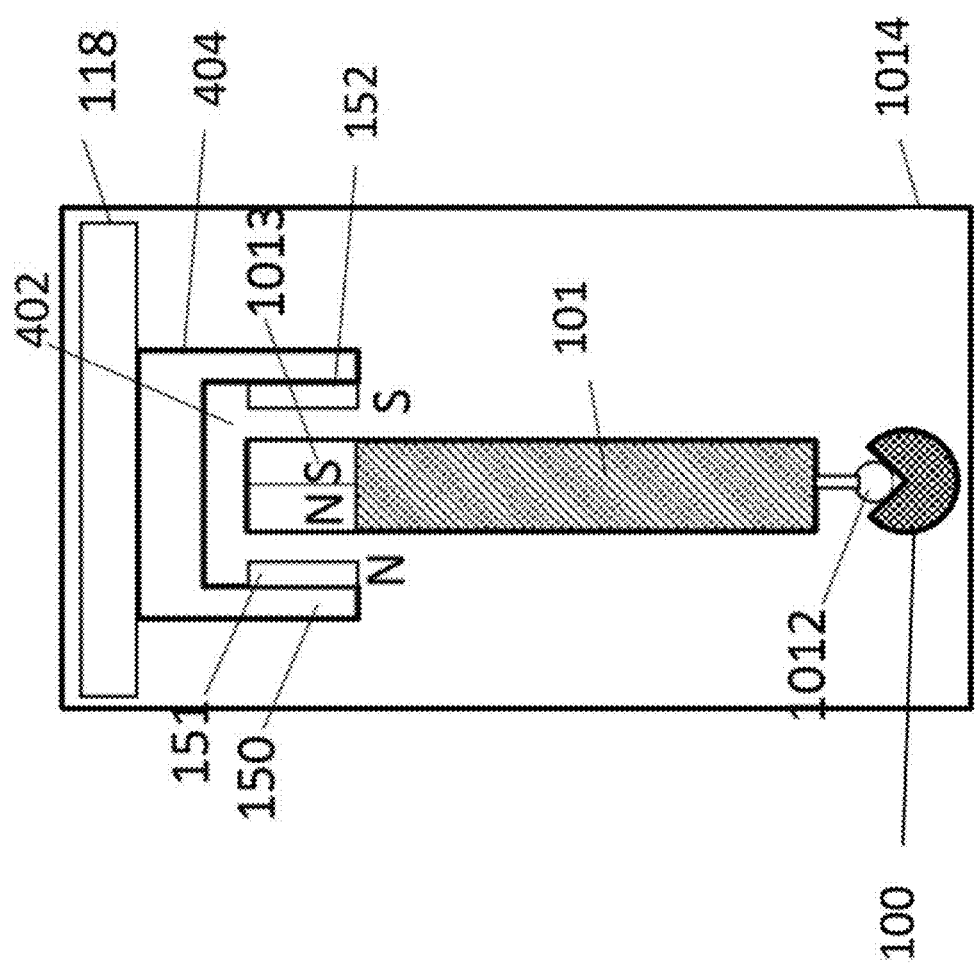
FIG. 4 illustrates a cross section of the transport mechanism of FIG. 3.

As shown in FIGS. 2-4, the frame 101 further comprises a vertical mechanism 1013 for enabling the frame 101 to remain vertically while the wafers coupled to the frame 101 are being processed by the manufacturing system 10. The vertical mechanism 1013 is configured to interface with a channel 402 of a track 404 coupled to a support structure 118 (FIG. 4). In particular, the channel 402 is configured to receive the vertical mechanism 1013, so that the frame 101 is slidable relative to the track 404, and is maintained in a vertical orientation.

In the illustrated embodiments, the vertical mechanism 1013 includes a magnet (referred to herein as a "first magnet"). As shown in FIG. 4, which is a side view of FIG. 3, the first magnet of the vertical mechanism 1013 has N pole and S pole. The track 404 has a magnetic shield 150 with a concave or C-shape cross-sectional shape. The track 404 also has a second magnet 151 with a N pole facing the N pole of the vertical mechanism 1013, and a third magnet 152 with a S pole facing the S pole of the vertical mechanism 1013. During processing of the wafers 20 carried by the frame 101, the frame 101 (and the wafers 20) are kept upright by the repulsion action between the first magnet of the vertical mechanism 1013 and the second magnet 151, and the repulsion action between the first magnet of the vertical mechanism 1013 and the third magnet 152. In the illustrated example, the top of the vertical mechanism 1013 is spaced away from the inner surface of the track 404, so that the top of the vertical mechanism 1013 is not in contact the inner surface of the track 404. The opposite sides of the vertical mechanism 1013 are also spaced away from the inner side surfaces of the track 404 due to the opposite poles of the interfacing magnets. Thus, movement of the frame 101 relative to the track 404 does not generate any particles and pollution problem is avoided.

In other embodiments, the vertical mechanism at the top of the frame 101 can also be a transport mechanism.

In the illustrated embodiments, the vertical mechanism 1013 is arranged at the top of the frame 101. In other embodiments, the vertical mechanism 1013 may also be provided at other locations, such as at the bottom of the frame 101, at the side of the frame 101, etc.

In other embodiments, the frame 101 does not include the transport mechanism 1012. For example, in some embodiments, the transport path 100 may include the transport mechanism 1012, such as one or more wheels, one or more rollers, etc., which mechanically supports the frame 101, and allows the frame 101 to move along the transport path 100. In further embodiments, the bottom part of the frame 101 may not be in contact with any track, and the track may not be needed. In such cases, the top track 118 may include mechanical component(s) configured to detachably couple to the frame 101, while maintaining the frame 101 vertically and supporting the weight of the frame 101.

Figure 5:
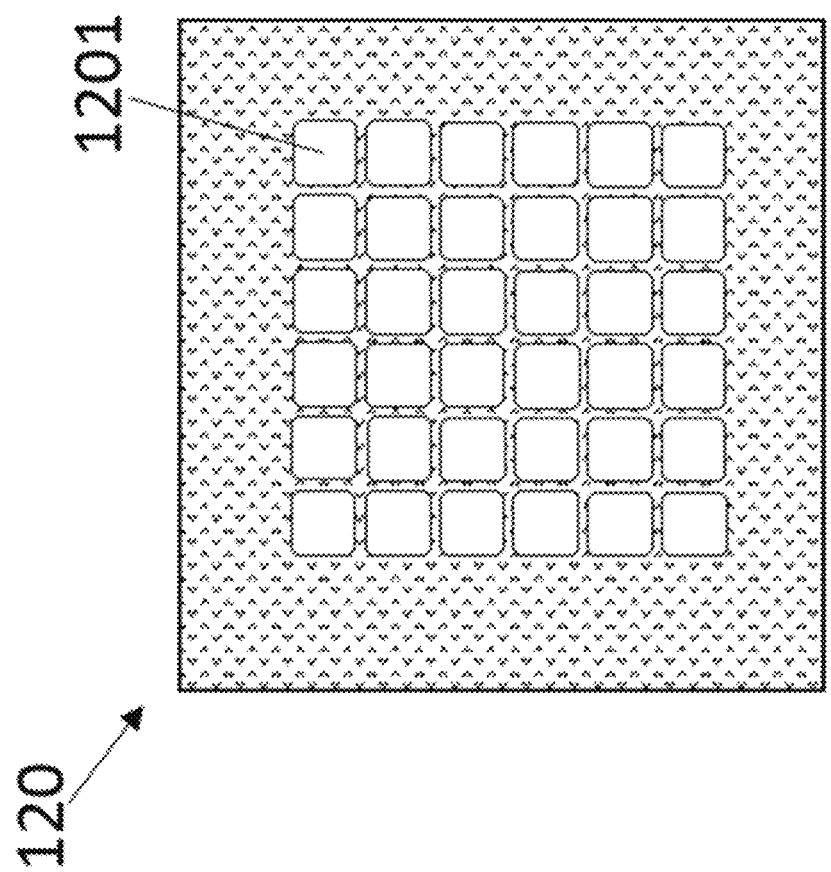
FIG. 5 illustrates a membrane for coupling with the frame of FIG. 2.

FIG. 5 illustrates an example of a membrane (e.g., adhesive film) 120 that is configured to couple to the frame 101 of FIG. 3. The membrane 120 has a plurality of membrane openings 1201 that correspond with respective wafers (that are to be coupled to the membrane 120). The frame opening 1011 of the frame 101 exposes the membrane 120 and also exposes the membrane openings 1201. The frame opening 1011 and the membrane openings 1201 also cooperate with each other to expose the wafers that are coupled to the respective membrane openings 1201 during the manufacturing process.

The material of the membrane 120 may be made of a material which is resistant to high temperature and/or large temperature change without significant deformation, and which is chemically resistant to plasma reactions. In this way, the membrane 120 can withstand high-temperature while being processed by the manufacturing system 10. In some cases, the temperature in one or more stations of the manufacturing system 10 is not higher than 250 degrees Celsius, and the membrane 120 is not prone to deformation under such temperature. Also, in some cases, the adhesion effect of the wafers on the membrane 120 is not negatively affected by the high temperature reached during the manufacturing process performed by the manufacturing system 10. In some embodiments, Silicone-based adhesive or any other adhesive that is capable of withstanding high temperature (e.g., higher than 150 degree Celsius, such as anywhere from 200-250 degree Celsius, higher than 250 degree Celsius, etc.) may be used to adhere the wafers onto the membrane 120. By means of non-limiting examples, the material of the membrane 120 may be polyimide, polyester polypropylene, etc. In some embodiments, the membrane 120 may be made from a material that can withstand an amount of heat involved during plasma process to form layers on the wafers. In some embodiments, the membrane 120 will become a component of the solar cell module after the manufacturing process is completed. In such cases, the membrane 120 may be made from a material that is transparent or semi-transparent for future light passage after being assembled as part of a solar cell module.

In the illustrated example, each membrane opening 1201 has an area that is configured to expose a majority of the area of the corresponding wafer 20 to be attached to the membrane 120. This configuration is advantageous because it allows the membrane opening 1201 to expose a majority of the surface area of each of two opposite surfaces of the wafer 20. As a result, layers of solar cell components may be formed by the manufacturing system 10 on both opposite sides of the wafer 20 while the wafer 20 is being carried by the frame 101 with the membrane 120.

In the example of FIG. 5, the membrane 120 has thirty-six membrane openings 1201. In other examples, the membrane 120 may have other numbers of membrane openings 1201. For example, in other examples, the membrane 120 may have fewer than thirty-six membrane openings 1201, such two rows of six membrane openings (i.e., twelve membrane openings), one membrane opening, etc. In other examples, the membrane 120 may have more than thirty-six membrane openings 1201.

Figure 6C:
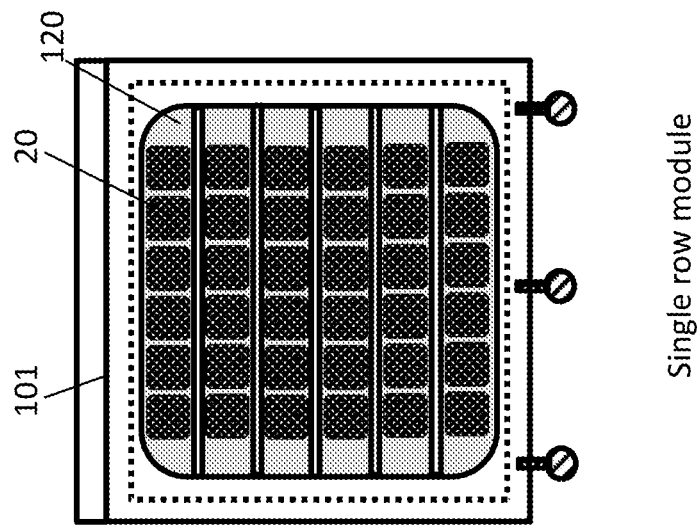
FIGS. 6A-6C illustrate different variations of membrane for coupling with the frame of FIG. 2.
Figure 6B:
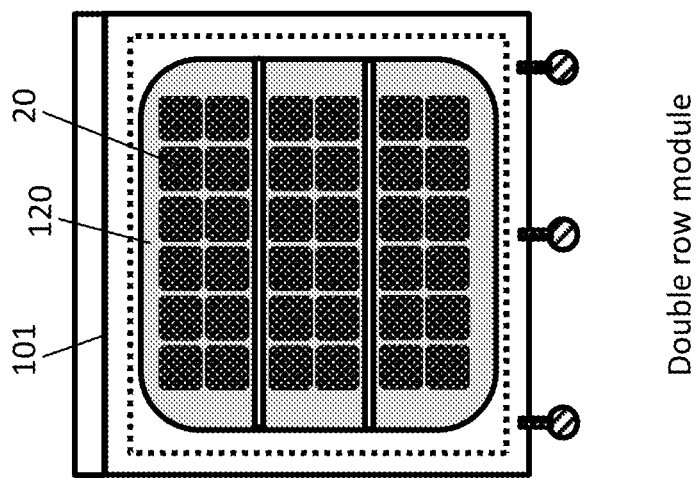
Figure 6A:
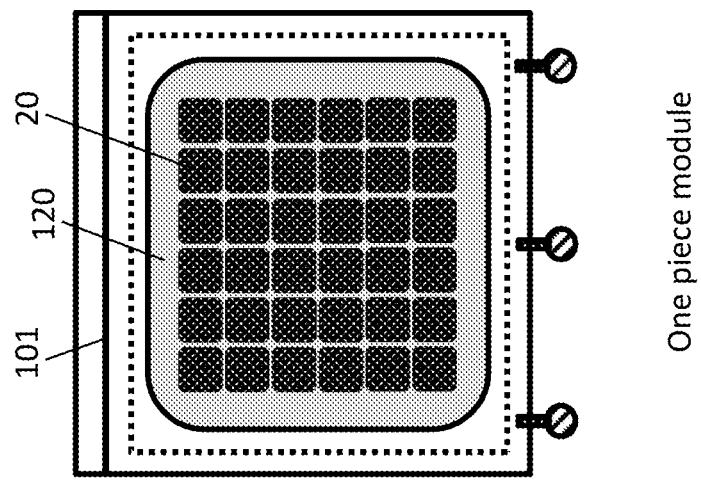

It should be noted that the frame 101 is not limited to carrying one membrane 120. In frame 101 may be configured to couple to one membrane 120 (FIG. 6A), or multiple membranes 120 (FIGS. 6B-6C). FIG. 6B illustrates the frame 101 carrying three membranes 120, with each membrane 120 having twelve wafers 20 coupled thereto. FIG. 6C illustrates the frame 101 carrying six membranes 120, with each membrane 120 having six wafers 20 coupled thereto. The frame 101 may carry other numbers of membranes 120. Also, each membrane 120 may carry other numbers of wafers 20.

Figure 6D:
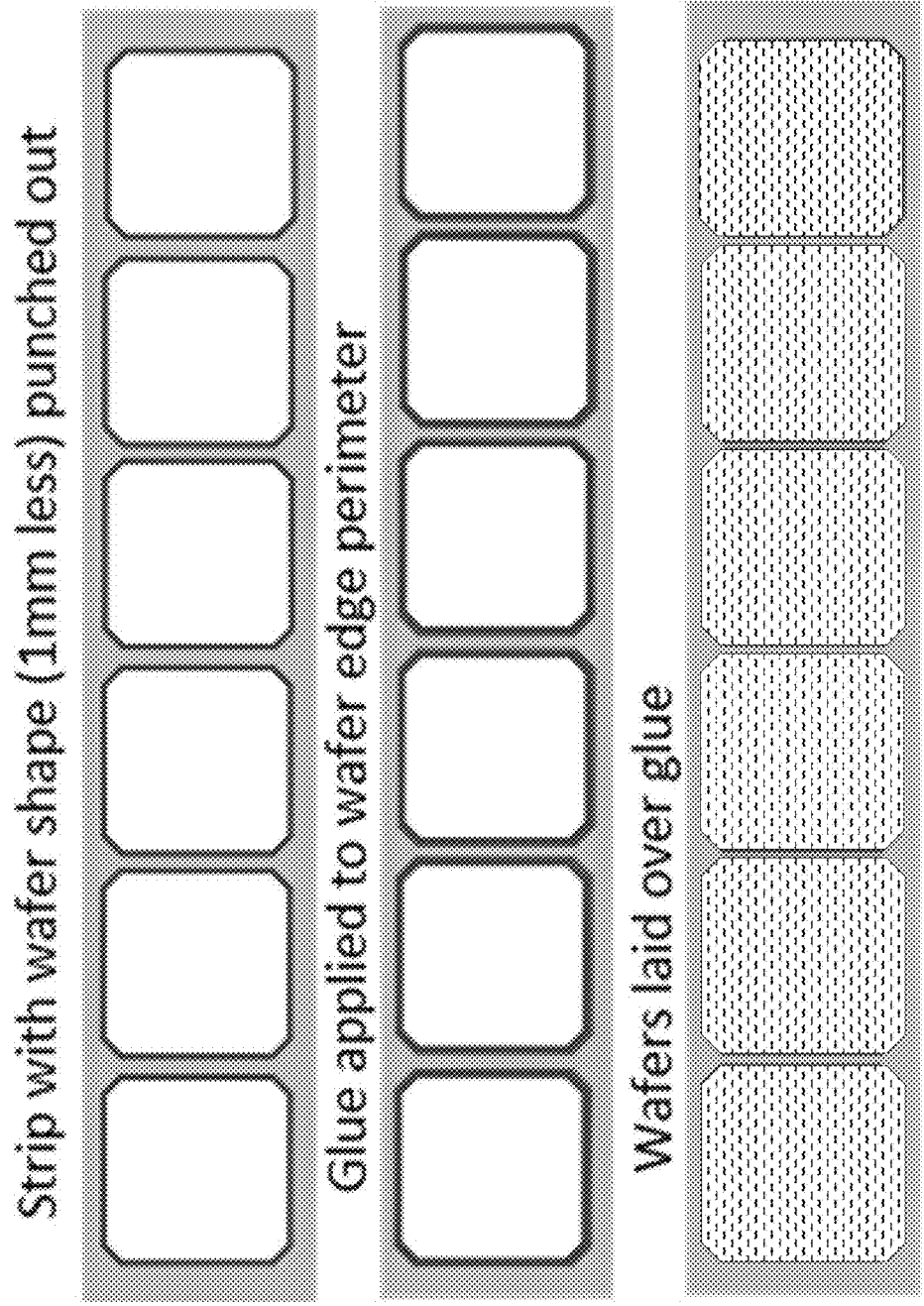
FIG. 6D illustrates a method of attaching wafers to a membrane.

FIG. 6D illustrates a method of coupling wafers 20 to the membrane 120. As shown in the top diagram, the membrane 120 has membrane openings 1201. Each membrane opening 120 has a size (area) that is less than a total area of a corresponding wafer 20. In the illustrated example, the cross sectional dimension of the membrane opening 120 is 2 mm less than a cross sectional dimension of the wafer 20. This allows the wafer 20 to overlap the membrane 120 by 1 mm at each of two opposite sides of the wafer 20. Next, referring to the middle diagram, an adhesive is applied to the parts of the membrane 120 surrounding the membrane openings 1201. In some cases, the application of the adhesive may be performed by an adhesive device (e.g., automated glue dispenser), and the adhesive device may be a part of the manufacturing system Next, refer to the bottom diagram, the wafers 20 are coupled to the membrane 120 by the adhesive, forming a strip of wafers (wafer strip). When the wafers 20 are coupled to the membrane 120, the wafers 20 cover the respective membrane openings 1201, and the membrane openings 1201 expose a majority of the areas of the respective wafers 20.

In other embodiments, the width (measured in a direction that is perpendicular to a perimeter of the membrane opening) of overlap between a wafer 20 and a part of the membrane 120 adjacent the membrane opening may be different from 1 mm. For example, the width of the overlap may be anywhere from 0.3 mm to 3 mm, or anywhere from 0.4 mm to 2 mm, or anywhere from 0.5 mm to 1.5 mm.

Figure 6E:
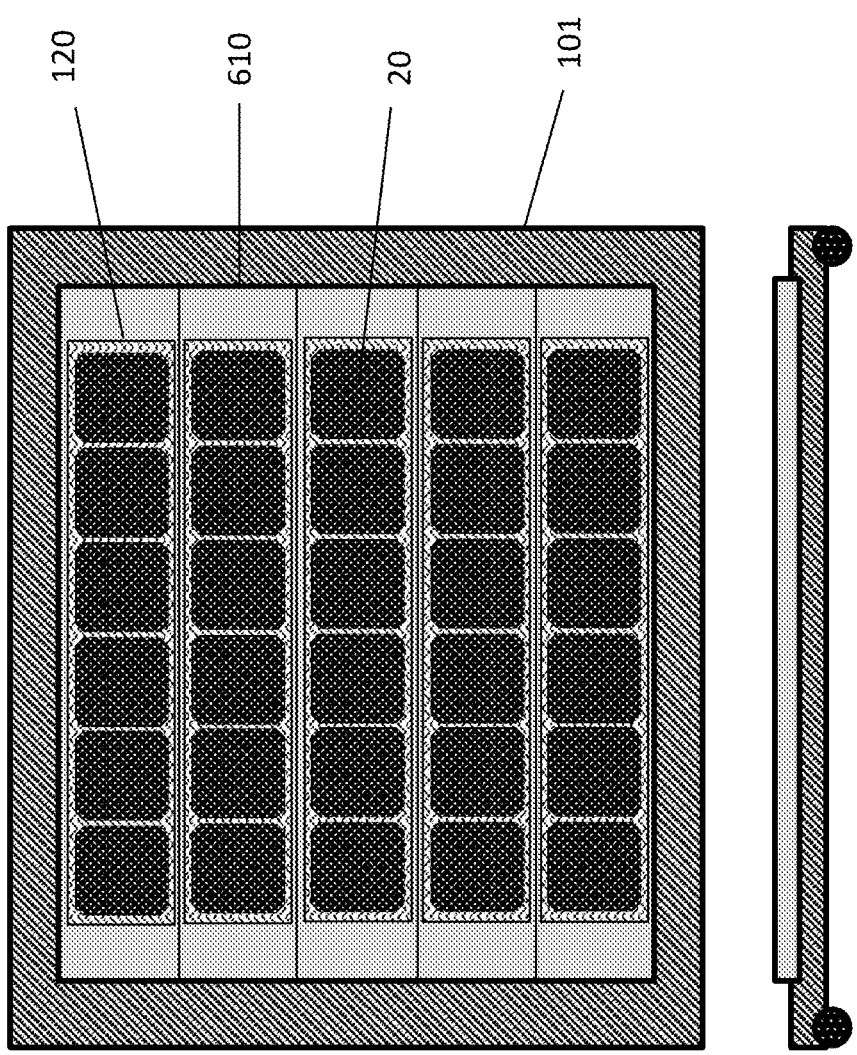
FIG. 6E illustrates a frame having multiple subframes for carrying respective membranes and respective sets of wafers.

As discussed, the membrane 120 may be configured to couple to the frame 101. In some cases, the membrane 120 may couple directly to the frame 101. In some embodiments, the coupling may be achieved using an adhesive, such as a Silicone-based adhesive. The adhesive may be applied by the manufacturing system 10. Alternatively, the membrane 120 may come with the adhesive on its surface (e.g., at one or more locations along the outer perimeter portions of the membrane 120). In other cases, the membrane 120 may couple indirectly to the frame 101. For example, as shown in FIG. 6E, in some cases, each membrane 120 may be coupled to a subframe 610, and the subframe 610 is coupled to the frame 101.

Figure 6F:
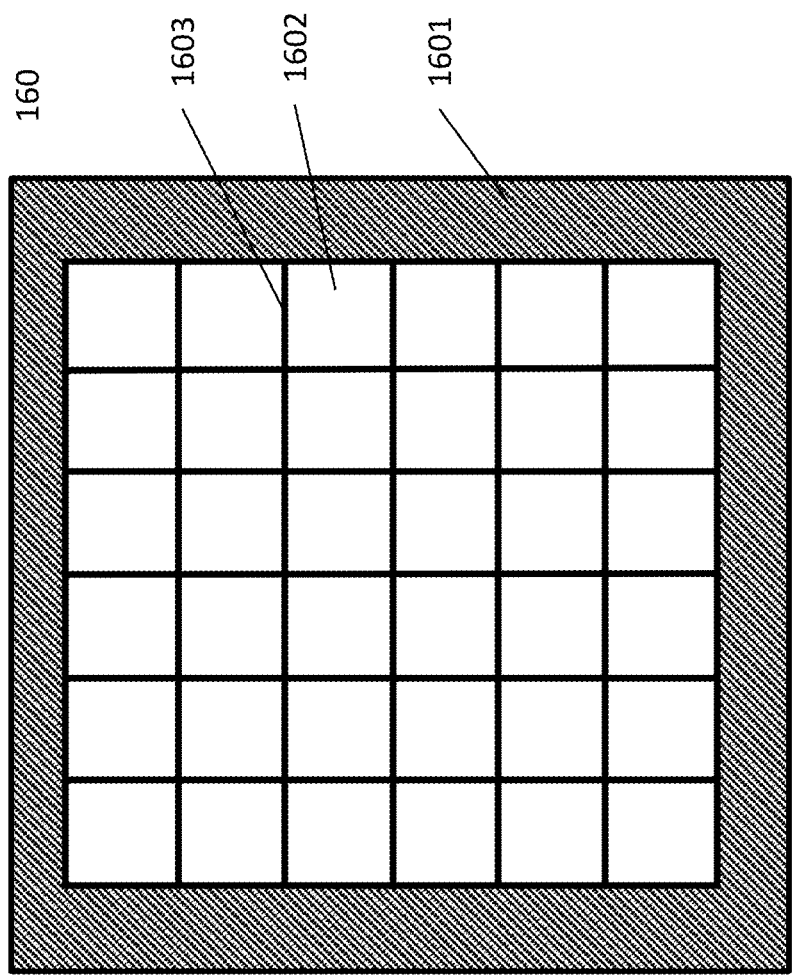
FIG. 6F illustrates isolation grid configured to isolate wafers from each other.

In some cases, after wafers 20 are mounted to the membrane 120, and after the membrane 120 is coupled to the frame 101, an isolation grid may be coupled to the membrane 120 to isolate the wafers, or groups of wafers. Referring to FIG. 6F, which shows an example of an isolation grid device 160 having a frame 1601, and grid windows 1602 defined by an isolation grid 1603 disposed on the frame 1601. The isolation grid device 160 is configured for placement over the membrane 120 in a superimposed configuration (with the major plane of the isolation grid device 160 being parallel to the major plane of the membrane 120) so that the isolation grid 1603 are disposed between adjacent wafers 20. The isolation frame device 160 may optionally further comprise a detachable mechanism for detachably connecting the frame 1601 with the frame 101 and/or with the membrane 120. The frame 1601 and the isolation grid 1603 may be made from a metal or an alloy, such as an aluminum alloy. The surface of the frame 1601 and the isolation grid 1603 may be coated with a plasma resistant coating for protecting the surfaces of the frame 1601 and the isolation grid 1603 (e.g., preventing the surfaces of the frame 1601 and the isolation grid 1603 from being corroded by plasma).

Although one isolation grid device 160 is shown, during use, there may be two isolation grid devices 160 disposed on opposite sides of the membrane 120. The isolation grid devices 160 may be coupled to the frame 101 and/or to the membrane 120.

During deposition process performed by the manufacturing system 10, conductive material is deposited over opposite surfaces of the wafers 20 to create conductive layers (front conductive layer over front/first sides of the wafers 20, and back conductive layer over back/second sides of the wafers 20). For example, the front conductive layer may include conductive material extending across the front surface of a first wafer, across the area between the first wafer and an adjacent (second wafer), and across the front surface of the second wafer. The isolation grid devices 160 prevent the conductive material from being deposited onto opposite surfaces of the membrane 120 at locations between the wafers 20, because those locations are covered by the isolation grids 1603 of the isolation grid devices 160. After the conductive layers are created over opposite surfaces of the wafers 20 are created, the isolation grid devices 160 on opposite sides of the membrane 120 can then be removed.

When the isolation grids 1603 are subsequently removed, the deposited conductive material on the isolation grids 1603 at opposite sides of the membrane 120 between the adjacent processed wafers are also removed along with the isolation grids 1603. As a result, the conductive layer on each side of the processed wafers is "broken" down into individual smaller conductive layers for the respective processed wafers. Accordingly, the initial electrical connection provided by the front conductive layer between the wafers 20 is disconnected, and the initial electrical connection provided by the back conductive layer between the wafers 20 is also disconnected. The wafers 20 may subsequently be electrically reconnected in a different manner—e.g., front bus bars formed over a front conductive layer of a first processed wafer (first substrate) may be electrically connected to back bus bars formed over a back conductive layer of a second processed wafer (second substrate) that is adjacent to the first processed wafer (first substrate). In some cases, the material of the isolation grid 1603 may be a conductor material, so that the plasma utilized during the manufacturing method may be continuously guided away. This facilitates continuous deposition on the surface of the substrate to form the conductive layer with a desired thickness. The isolation grid device 160 may also help achieve uniform thickness of the conductive layer formed on each substrate.

It should be noted that the isolation grid device 160 is not limited to the configuration shown, and that the isolation grid device 160 may have other configurations in other embodiments. For example, in other embodiments, the isolation grid device 160 may be one or more tapes configured (sized and/or shaped) for placement between adjacent wafers 20. During use, the tape(s) is placed on the membrane 120 between the wafers 20. There may be a first tape placed on a first surface of the membrane 120, and a second tape placed on a second surface (opposite the first surface) of the membrane 120. The tapes prevent the conductive material from being deposited onto the opposite surfaces of the membrane 120 between the wafers 20. After the conductive layers are formed over opposite surfaces of the wafers the tapes are removed to break up the conductive layer on each side into individual smaller conductive layers for the respective processed wafers 20.

In some cases, two isolation grids 160 are provided for the respective two opposite sides of the frame 120 to isolate the wafers 20 before the frame 120 is placed inside the preparation station 107. In particular, the first isolation grid device 160 is disposed over a first surface of the membrane 120 to isolate the wafers 20 that are coupled to the first surface of the membrane 120, and the second isolation grid device 160 is disposed over a second surface (opposite the first surface) of the membrane 120 to isolate the spaces behind the respective wafers 20. The frame 120 together with the two isolation grids 160 is then transported to different stations of the manufacturing system 10 for processing the wafers. After the wafers are processed, the processed wafers together with the frame 120 and the isolation grids 160 are then outputted to the storage station 112.

In some embodiments, the frame 101 may optionally include one or more mechanical connectors configured to couple to one or more isolation grid devices 160. By means of non-limiting examples, the mechanical connector may be a screw, a clamp, a snap-fit connector, a frictional coupler, a clip, etc.

In other cases, the frame 120 carrying the wafers 20 without the isolation grid devices 160 may be inserted into the preparation station 107. In such cases, the isolation grid device(s) 160 may be provided by the manufacturing system 10 after the frame 120 is inserted into the preparation station 107. For example, one or more isolation grid devices 160 may be provided to couple to the frame 101 before/in/after the front film station 102, before/in/after the back film station 103, in a buffer station 110, or in the magnetron sputtering station 106. After the magnetron sputtering station 106 has created the front conductive layer and the back conductive layer on the respective front and back surfaces of the processed wafers, the isolation grid device(s) 160 may then be separated from the frame 101. The removal of the isolation grid device(s) from the frame 101 breaks down the front conductive layer into individual smaller front conductive layers for the respective wafers, and also breaks down the back conductive layer into individual smaller back conductive layers for the respective wafers, as similarly discussed.

In other embodiments, the isolation grid device 160 is optional, and it is not needed for the manufacturing system 10 to process the wafers 20. If the isolation grid device 160 is not arranged between the wafers 20, the front conductive layer and the back conductive layer will extend over the area between adjacent wafers 20. In such cases, the front conductive layer may be broken down into individual smaller front conductive layers for the respective wafers 20 using a laser device. Similarly, the back conductive layer may also be broken down into individual smaller back conductive layers for the respective wafers 20 using the laser device or a separate laser device. By controlling the energy size of the laser, the removal depth can be well controlled, so that the front conductive layer and the back conductive layer between adjacent wafers 20 can be removed without damaging the membrane 120.

As discussed, when attaching wafers to the membrane 120, an adhesive may be applied onto the membrane 120. In some cases, some of the adhesive may extend to the area on the membrane 120 between the wafers. In such cases, the adhesive at that area may be removed from the surface of the membrane 120 of the substrate before the isolation grid device 160 is disposed onto the membrane 120. Such technique will prevent the isolation grid device 160 from sticking to the membrane 120. In an alternative technique, the adhesive is applied to only the area on the membrane 120 that is configured to engage the wafers 20, thereby providing the area of the membrane 120 between the wafers 20 that is free of adhesive. In a further alternative technique, if some of the adhesive extends to the area on the membrane 120 between the wafers 20, an adhesive tape may be placed over the area to cover the adhesive (with the adhesive side of the adhesive tape being in contact with the adhesive on the membrane 120). In other embodiments, another membrane may be placed over that area to cover the adhesive. In one implementation, the wafers 20 may be coupled to a first membrane 120, and a second membrane 120 may be adhered to the first membrane 120 to cover the area between the wafers 20 that may contain adhesive. The first membrane 120 may have multiple membrane openings, and the second membrane 120 may also have multiple membrane openings that correspond respectively to the membrane openings of the first membrane 120. The membrane openings of the second membrane 120 may be sized to accommodate to the respective wafers 20 coupled to the first membrane 120. The membrane openings of the first membrane 120 may be smaller in size compared to the membrane openings of the second membrane 120, because the first membrane 120 need to provide some areas around the membrane openings to allow the wafers 20 to couple thereto.

Figure 6G:
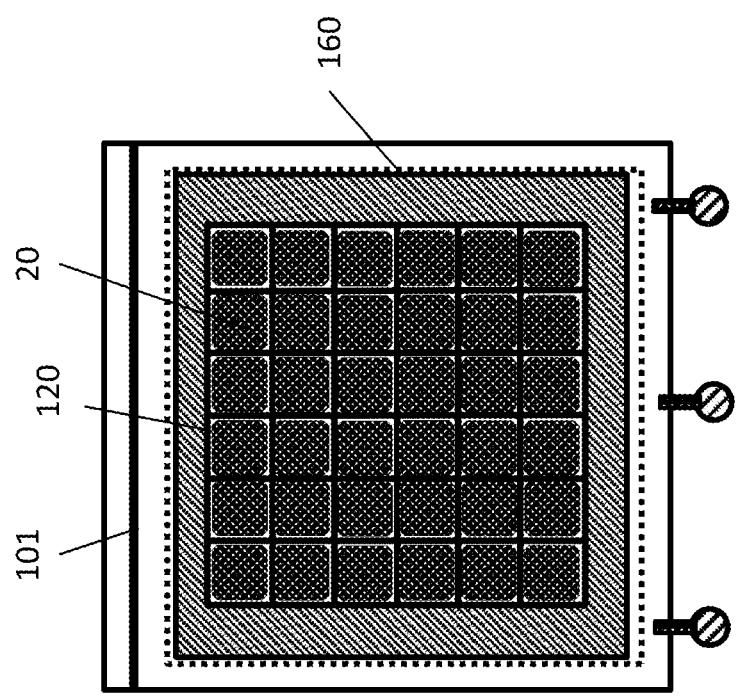
FIG. 6G illustrates isolation of rows of wafers.

It should be noted that the isolation grid device 160 is not limited to the example of configuration shown, and that the isolation grid device 160 may have other configurations. For example, as shown in FIG. 6G, in other embodiments, the isolation grid device 160 may have isolation grids configured to isolate rows of wafers 20.

Figure 6H:
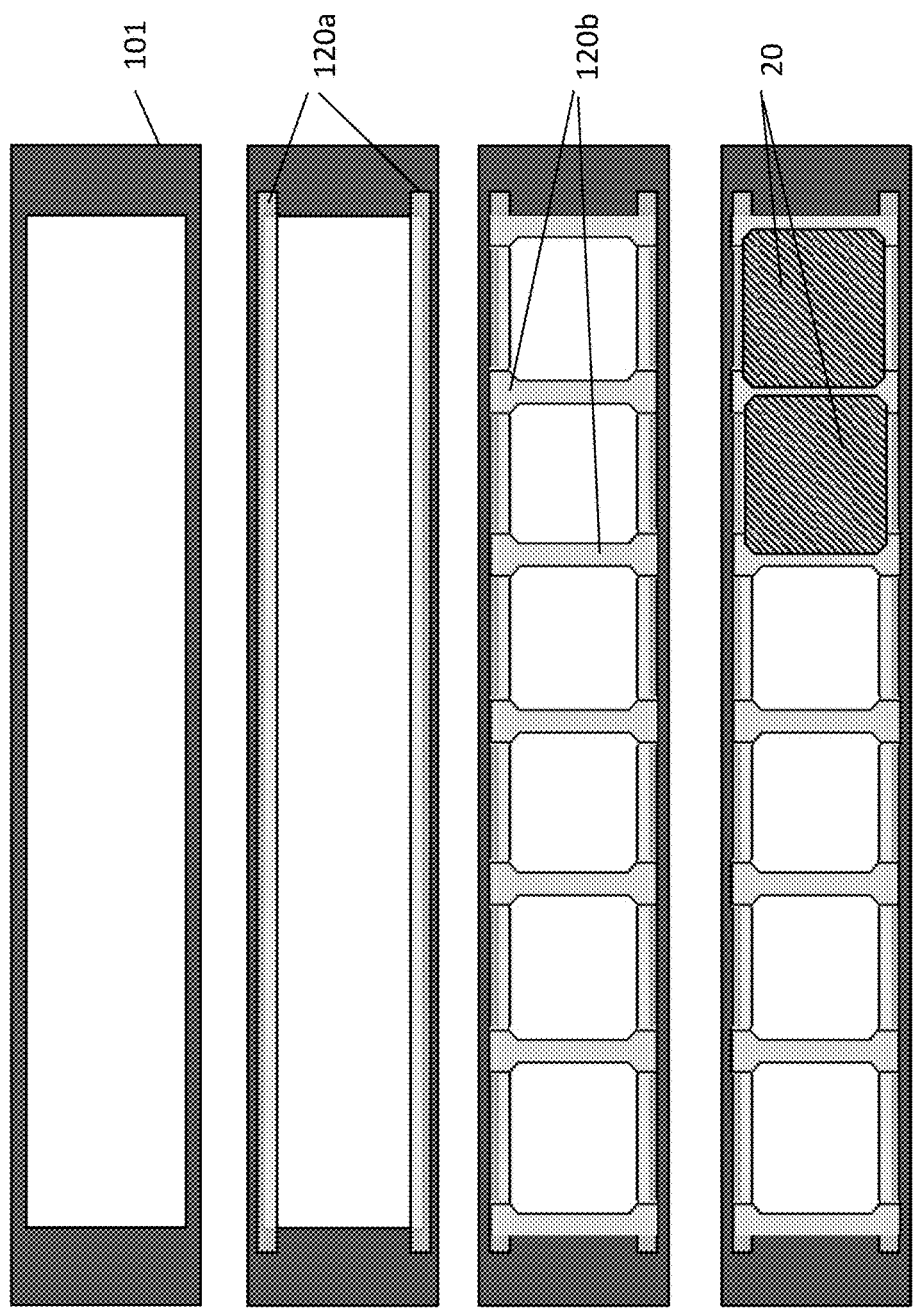
FIG. 6H illustrates another method of attaching wafers to a membrane, particularly showing the membrane having multiple membrane portions.

Also, the membrane 120 is not limited to a planar structure having an unity-configuration or a cut-out opening. In other embodiments, the membrane 120 may be made from multiple membrane portions. FIG. 6H illustrates another method of attaching wafers to a membrane 120, particularly showing the membrane 120 having multiple membrane portions. In the illustrated example, the membrane 120 includes two longitudinal membrane portions 120a, and multiple transverse membrane portions 120b that are perpendicular to the longitudinal membrane portions 120a. In the illustrated example, each vertical membrane portion 120b has a dog-bone or I shape. In other embodiments, each vertical membrane portion 120b may have a rectangular shape or any of other shapes. During use, the longitudinal membrane portions 120a are detachably coupled to the frame 101. Then the transverse membrane portions 120b are detachably coupled to the frame 101 and/or the longitudinal membrane portions 120a, so that the membrane portions 120a, 120b collectively form one or more openings. The wafer(s) 20 may then be detachably coupled to the membrane 120 formed by the membrane portions 120a, 120b. Using multiple membrane portions (e.g., strips) to form the seal around the wafer 20 is advantageous because such technique reduces waste that may otherwise result if the membrane 120 is formed by cutting out a center portion from a polygonal shape (e.g., a square or a rectangle).

Film Station

Figure 7:
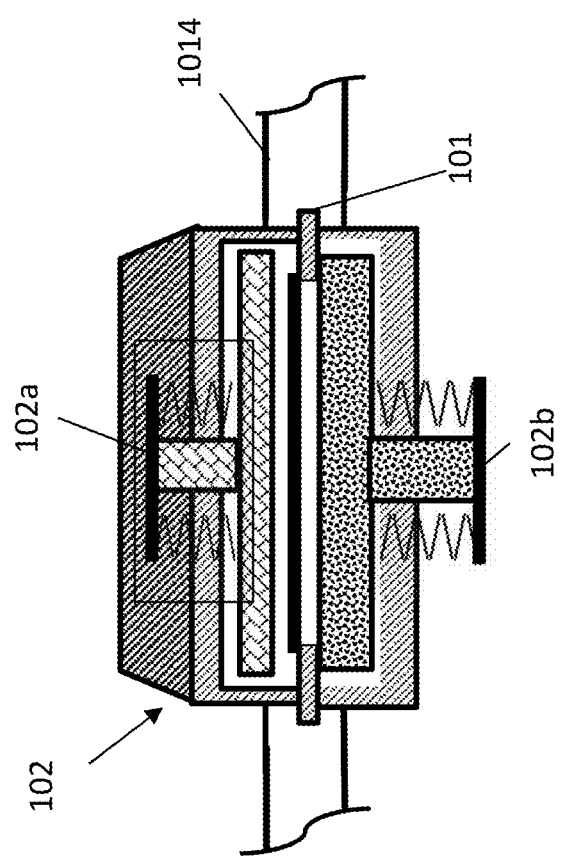
FIG. 7 illustrates a processing chamber in a processing mode.
Figure 8:
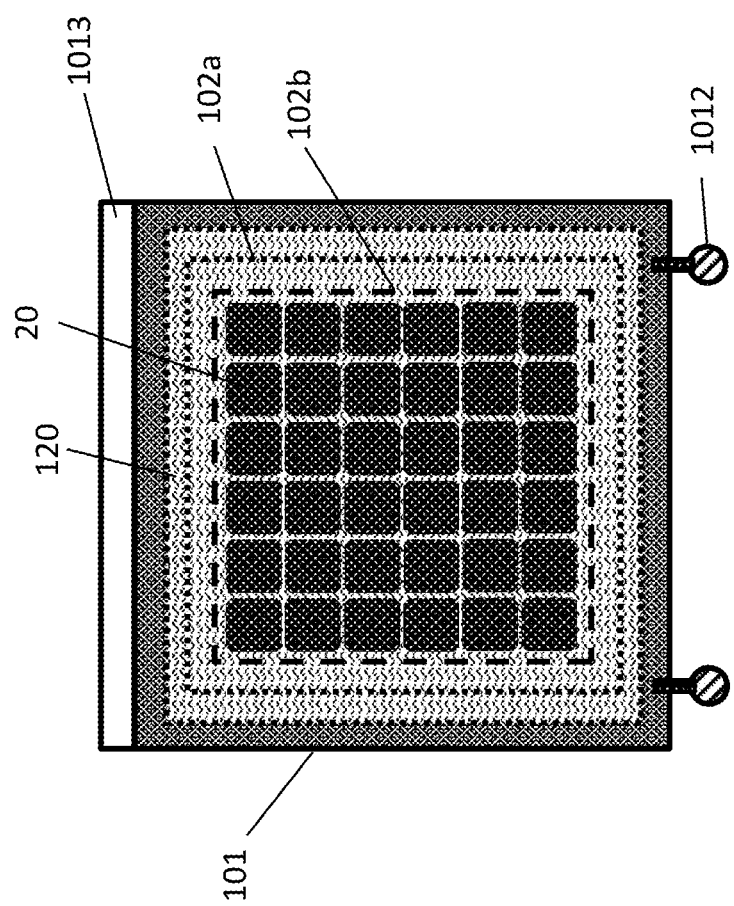
FIG. 8 illustrates relative positioning between components of the processing chamber of FIG. 7 and the frame of FIG. 2.
Figure 9:
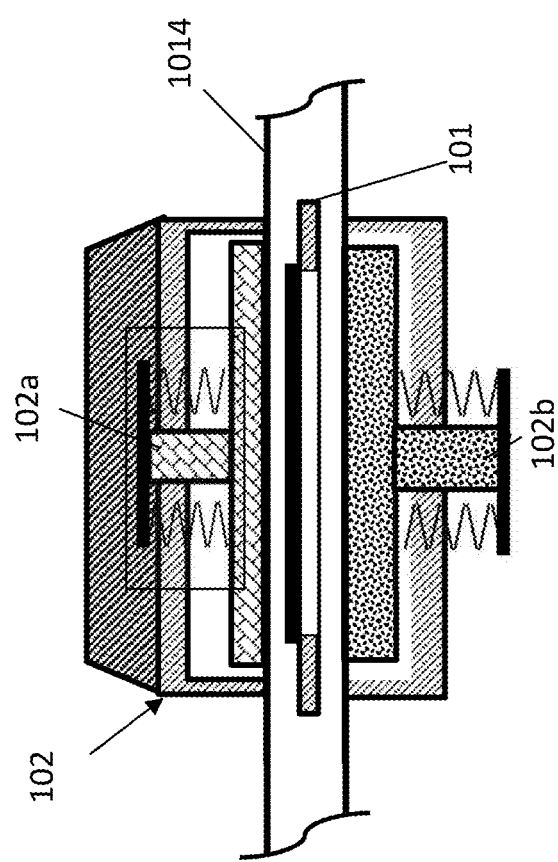
FIG. 9 illustrates the processing chamber of FIG. 7 in a transfer mode.

As discussed, the film station 102/103 is configured to dispose one or more layers onto a surface of a wafer 20. The layers (or films) may include an I-layer and a N-layer. In other cases, the layers may include an I-layer and a P-layer. FIG. 7 illustrates a top view of the film station 102/103, particularly showing the film station 102/103 having first and second electrodes 102a, 102b that are in operative positions for processing wafers carried by the frame 101. FIG. 8 is a front view of the film station 102/103 of FIG. 7. FIG. 9 illustrates a top view of the film station 102/103, particularly showing the first and second electrodes 102a, 102b in non-operative positions.

As shown in FIGS. 7 and 8, the first electrode 102a and the second electrode 102a of the film station 102/103 are on opposite sides of the frame 101. The first electrode 102a and the second electrode 102b can move towards the transport track 101 or towards the frame 101 to form a closed space covering the wafers 20 that are to be processed. The movement of the electrodes 102a, 102b may be achieved by one or more driving devices in the manufacturing system 10. When the electrodes 102a, 102b are in their respective operative positions, the closed space covering the wafers is formed, and the electrodes 102a, 102b are operated to deposit one or more layers onto front surfaces of the wafers 20. The distance between the first electrode 102a and the wafers 20 may be adjusted to meet different processing requirements.

In some embodiments, the first electrode 102a (e.g., shower head) may move independently with respect to a front housing to adjust a processing gap. The front housing may be grounded, and may be disposed in contact with the frame 101 to form a closed loop for plasma (ground return). The second electrode 102b (e.g., heater) may move to close proximity of the membrane 120, but does not contact the membrane 120 (e.g., such may be achieved by using ceramic pins to ensure a small but fixed gap in between). The heater is prevented from contacting the frame to avoid the heater heating the frame. In some cases, a structure coupled to the second electrode 102b may come in contact with the frame 101 to provide support, and to seal the frame 101 against the front housing.

As shown in FIG. 1A, front film stations 102 are configured to form layers over the front surfaces of the wafers, and the back film stations 103 are configured to form layers over the back surfaces of the wafers, with the frame 101 carrying the wafers being transported to the different film stations 102, 103. Thus, the deposition sources associated with the front and back film stations 102, 103 respectively are located on opposite sides of the transport path 100. The back film station 103 has the same configuration as that of the front film station 103. Because the front and back film stations 102, 103 are configured to work on opposite surfaces of the wafers, the configuration of the back film station 103 is the same as that of the front film station 102, except that the electrodes 102a, 102b of the back film station 103 are reversed (compared to those of the front film station 102). Thus, the front of the wafer faces the first electrode 102a of the front film station 102 as the wafer is being processed (with the back of the wafer facing the second electrode 102b of the front film station 102), and after the wafer is transported to the back film station 103, the front of the wafer faces the second electrode 102b of the back film station 103 (with the back of the wafer facing the first electrode 102a of the back film station 103).

In some embodiments, the electrodes 102a, 102b of the film station 102/103 may be configured to form a front intrinsic layer (I-layer), and also a front doping layer (e.g., a N-layer or a P-layer) over front surfaces of the wafers 20. In other embodiments, the film station 102/103 may comprise a front intrinsic station and a front doping station, wherein the front intrinsic station is configured for forming a front intrinsic layer (I-layer), and the front doping station is configured for forming a front doping layer (e.g., N-layer or P-layer) over front surfaces of the wafers 20. In such cases, the front intrinsic station may have electrodes (like those shown in FIG. 7) dedicated for forming I-layer, and the front doping station may also have electrodes (like those shown in FIG. 7) dedicated for forming a doping layer. This configuration is advantageous because it results in less wait time between deposition of the intrinsic layer and doping layer.

In some embodiments, the electrodes 102a, 102b of the film station 102/103 may be configured to form a back intrinsic layer (I-layer), and also a back doping layer (e.g., a N-layer or a P-layer) over back surfaces of the wafers 20. In other embodiments, the film station 102/103 may comprise a back intrinsic station and a back doping station, wherein the back intrinsic station is configured for forming a back intrinsic layer (I-layer), and the back doping station is configured for forming a back doping layer (e.g., N-layer or P-layer) over back surfaces of the wafers 20. In such cases, the back intrinsic station may have electrodes (like those shown in FIG. 7) dedicated for forming I-layer, and the back doping station may also have electrodes (like those shown in FIG. 7) dedicated for forming a doping layer.

In some cases, the first electrode 102a of the film station 102/103 may comprise a gas shower head. In one embodiment, only the gas spraying head is movable, and a bellowed pipe is arranged on the periphery of the gas spraying head to achieve sealing. In another embodiment, the housing defining the cavity of the film station 102/103 and the gas spraying head are independently movable to adjust a processing distance (e.g., gap).

In the film station 102/103 of FIG. 7, a gas distribution plate is acting as a powered electrode, and a heater is acting as a ground electrode, wherein the heater may be moveable or fixed. The film station 102/103 may include a PECVD chamber in some embodiments.

As shown in FIG. 9, when material deposition is not performed, the first electrode 102a and the second electrode 102b are moved away from each other and away from the frame 101. In this configuration, the frame 101 can be transported along the transport path 100 to another processing station.

Figure 10A:
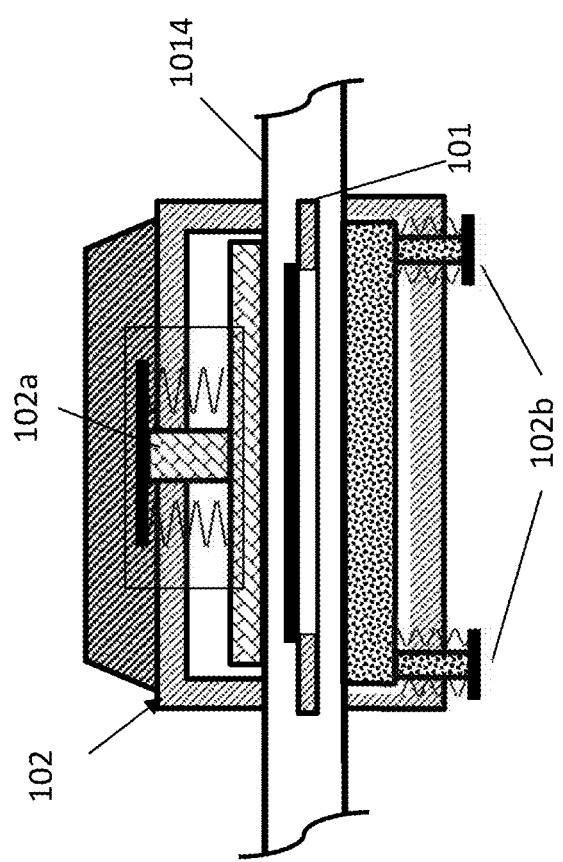
FIG. 10A illustrates another processing chamber.

The film station 102/103 may have other configurations in other embodiments. FIG. 10A illustrates another film station 102. The film station 102 of FIG. 10A is similar to that of FIG. 7, except that the film station 102 of FIG. 10A has a heater that is supported at the four corners (instead of the middle) of the heater. Supporting the four corners of the heater is advantageous because it allows a force to be exerted at the perimeter of the heater. The configuration of the film station 102/103 shown in FIG. 10A also allows a RF return to be implemented on the ground part at the front chamber body, and allows formation of a semi seal to contain reactive gases in the confined space between the upper and lower electrodes. Semi seal means that reactive gases are contained in the chamber volume with the pumping port also inside. external purge gases may push inside this volume through some of the cracks/slots/openings existed on the frame 101, the heater and the mechanical ground contact.

Figure 10B:
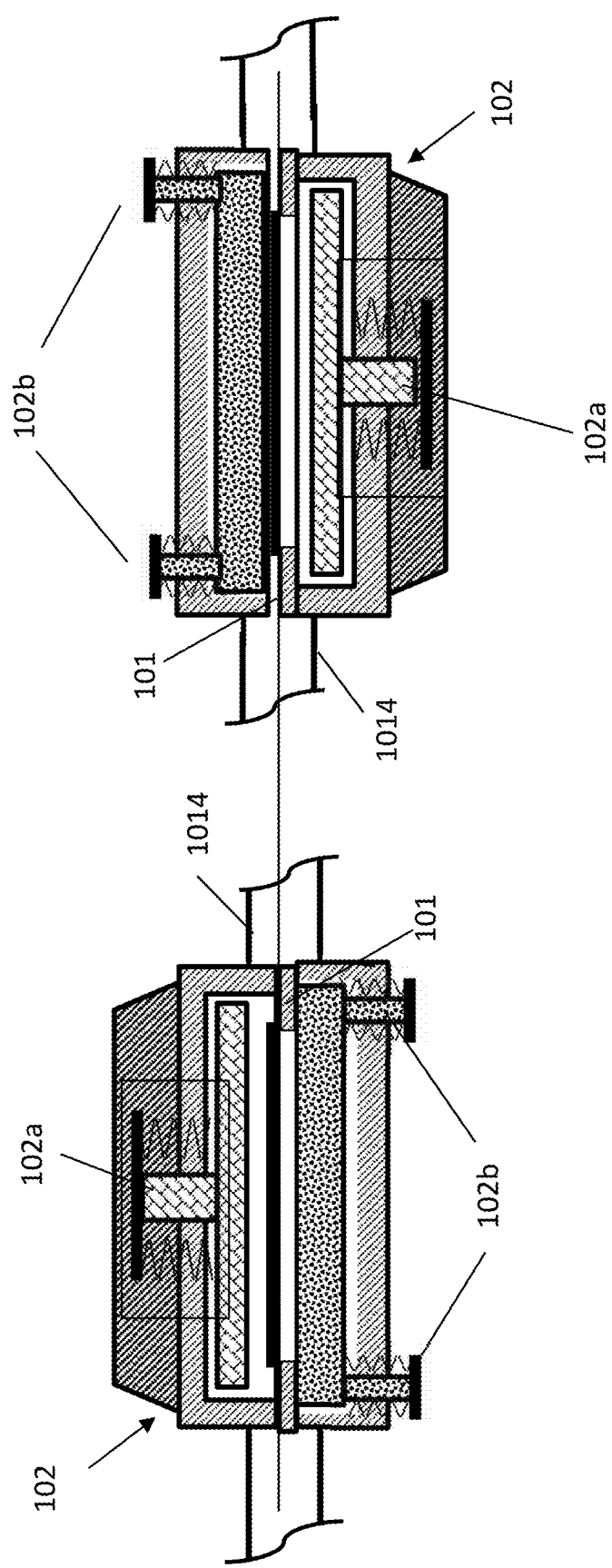
FIG. 10B illustrates two film stations, each of which having the configuration shown in FIG. 10A, and being in processing mode.

FIG. 10B illustrates two film stations 102, 103, each of which having the configuration shown in FIG. 10A. In the illustrated embodiments, each film station is in a processing mode. When in the processing mode, housings of each film station on opposite sides of the wafer(s) 20 moves towards the frame 101 carrying the wafer(s) One housing has the heater, and the other housing has the shower head. The shower head is then operated to deposit materials onto the wafer(s) 20.

Figure 10C:
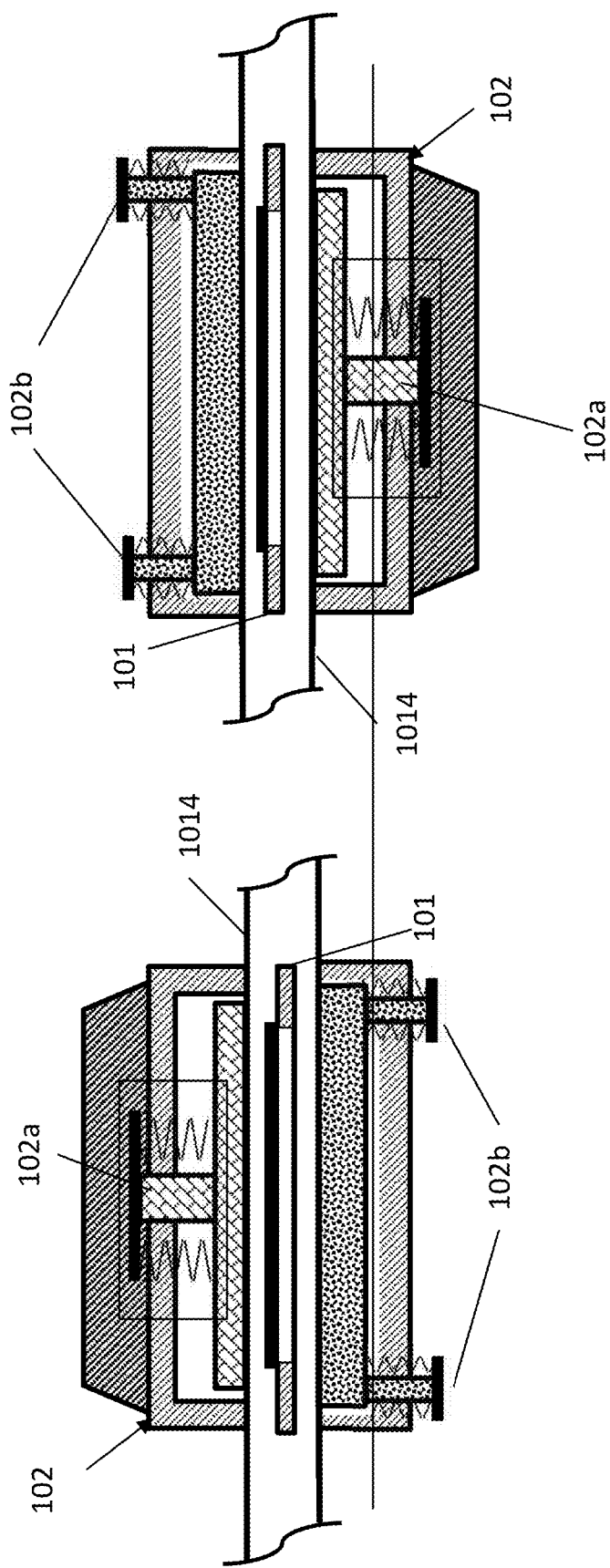
FIG. 10C illustrates the two film stations of FIG. 10B, being in transfer mode.

FIG. 10C illustrates the film stations 102, 103 of FIG. 10B in a transfer mode. When in the transfer mode, the housings of each film station on opposite sides of the wafer(s) 20 moves away from the frame 101 carry the wafer(s) 20. The frame 101 carrying the wafer(s) 20 can then be transported out of the film station.

In some embodiments, the film station 102 may be configured to form an intrinsic layer on first sides of respective wafers, and the film station 103 may be configured to form an intrinsic layer on second sides (opposite of respective first sides) of the respective wafers.

In other embodiments, the film station 102 may be configured to form a doping layer (e.g., N-layer or P-layer) on first sides of respective wafers, and the film station 103 may be configured to form a doping layer (e.g., N-layer or P-layer) on second sides (opposite of respective first sides) of the respective wafers.

Magnetron Sputtering Station

As shown in FIG. 1, the magnetron sputtering station 106 comprises a first magnetron sputtering device 106a and a second magnetron sputtering device 106b, wherein the first magnetron sputtering device 106a faces the front surfaces of the processed wafers (substrates), and the second magnetron sputtering device 106b faces the back surfaces of the processed wafers (substrates). Thus, the first and second magnetron sputtering devices 106a, 106b are located on opposite sides of the transport path 100. The first magnetron sputtering device 106a is configured to form a first conductive layer on front surfaces of the processed wafers, and the second magnetron sputtering device 106b is configured to form a second conductive layer on back surfaces (opposite from the first surfaces) of the processed wafers.

Figure 11:
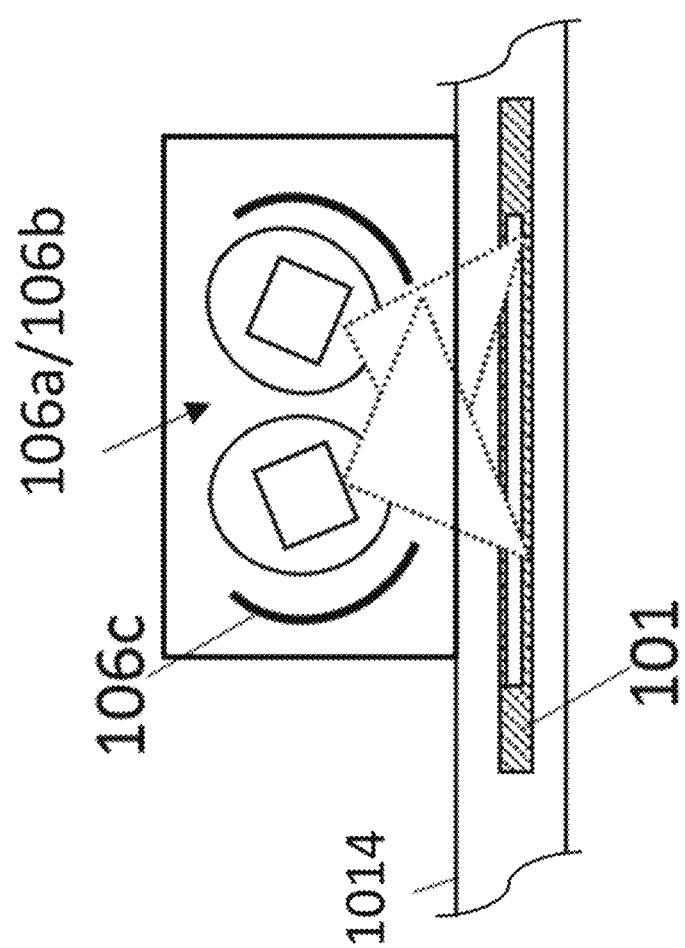
FIG. 11 illustrates a sputtering module with open shutters.
Figure 12:
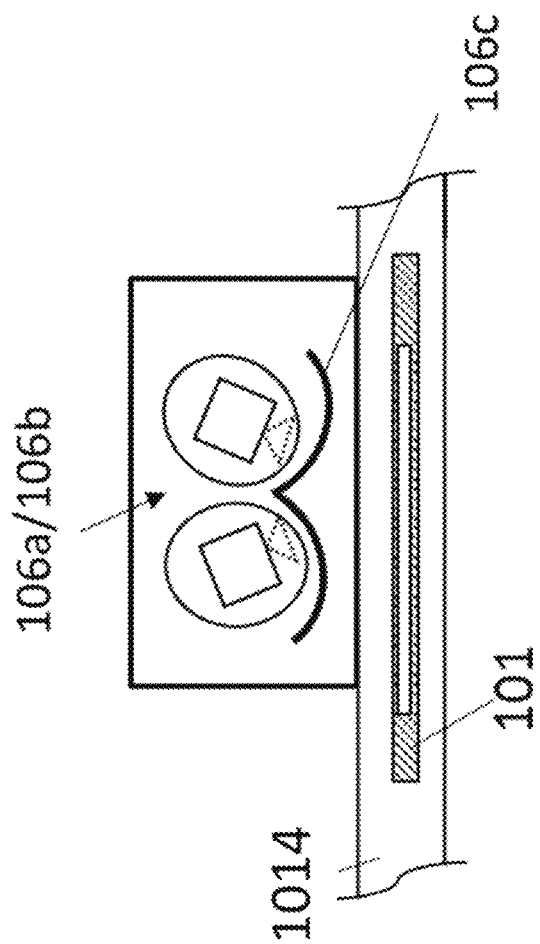
FIG. 12 illustrates the sputtering module with closed shutters.

FIG. 11 is a schematic structural diagram of the magnetron sputtering device 106a/106b of FIG. 1, particularly showing the magnetron sputtering device 106a/106b having shutters 106c that are opened. FIG. 12 is a structural schematic diagram of the magnetron sputtering device 106a/106b, particularly showing the magnetron sputtering device 106a/106b not depositing material because the shutters 106c are closed (i.e., the physical shields of the shutters 106c prevent the sputtered materials from reaching the substrates). In particular, when the shutters 106c are opened, the particles from the magnetron sputtering device 106a (or magnetron sputtering device 106b) can reach the surface of the processed wafer (substrate) (FIG. 11). When the shutters 106c are closed, the particles from the magnetron sputtering device 106a 9 or magnetron sputtering device 106b) cannot reach the surface of the processed wafer (FIG. 12).

During use, the frame 101 carrying the wafers 20 (with intrinsic layers and doping layers formed thereon) is transported to the first magnetron sputtering device 106a. The shutters 106c of the first magnetron sputtering device 106a opens to allow particles to be sputtered towards the front surface of the wafers 20. As a result, a front conductive layer is formed on the front surface of the substrate. The frame 101 carrying the wafers 20 is then transported to the second magnetron sputtering device 106b. The shutters 106c of the second magnetron sputtering device 106b opens to allow particles to be sputtered towards the back surface of the wafers 20. As a result, a back conductive layer is formed on the back surface of the substrate.

In other embodiments, instead of sequentially forming conductive front and back conductive layers respectively on the front and back surfaces of the wafers 20, the magnetron sputtering devices 106a, 106b may be arranged opposite from each other to thereby allow both the front and back conductive layers to be formed concurrently on the front and back surfaces of the wafers 20, respectively.

In some embodiments, the front conductive layer is formed first, and a back conductive layer is formed. In other embodiments, the back conductive layer is formed first, and a front conductive layer is formed. It should be noted that the term "front" and "back" are utilized to refer to two opposite sides of a planar object (e.g., wafer, module, etc.). The "front" conductive layer may be a first conductive layer, and the "back" conductive layer may be a second conductive layer, or vice versa.

In some embodiments, the front conductive layer provided by the magnetron sputtering device 106a may be an ITO layer, and may have conductive materials connecting to multiple substrates. Also, the back conductive layer provided by the magnetron sputtering device 106b may also be an ITO layer, and may have conductive materials connecting to multiple substrates. Because the substrates are connected to the membrane 120, the conductive layer on each side is formed to have an unity configuration extending across multiple substrates. Subsequently, the conductive materials are broken up into individual conductive portions for the respective substrates, such as by removal of isolation grid devices separating the substrates and/or by laser.

In some embodiments, the front conductive layer may extend to an edge of the substrate's front surface. Also, in some embodiments, the back conductive layer may extend to a location on the substrate's back surface away from an edge of the substrate's back surface, resulting in a gap between an end of the back conductive layer and the edge of the substrate's back surface. This gap reduces the risk of having the front conductive layer (e.g., ITO layer) contact the back conductive layer (e.g., ITO layer) to create a short circuit. In some embodiments, the gap between the end of the back conductive layer and the substrate's edge may be achieve by cover the perimeter portion of the substrate's back surface by portions of the membrane defining the membrane window. Thus, the back conductive layer extends to the edge of the membrane opening (that exposes the substrate's back surface). In other embodiments, the front conductive layer may extend to a location on the substrate's front surface away from an edge of the substrate, resulting in a gap between an end of the front conductive layer and the edge of the substrate's front surface.

Wafers Removal and Preparation of Frame

Figure 13:
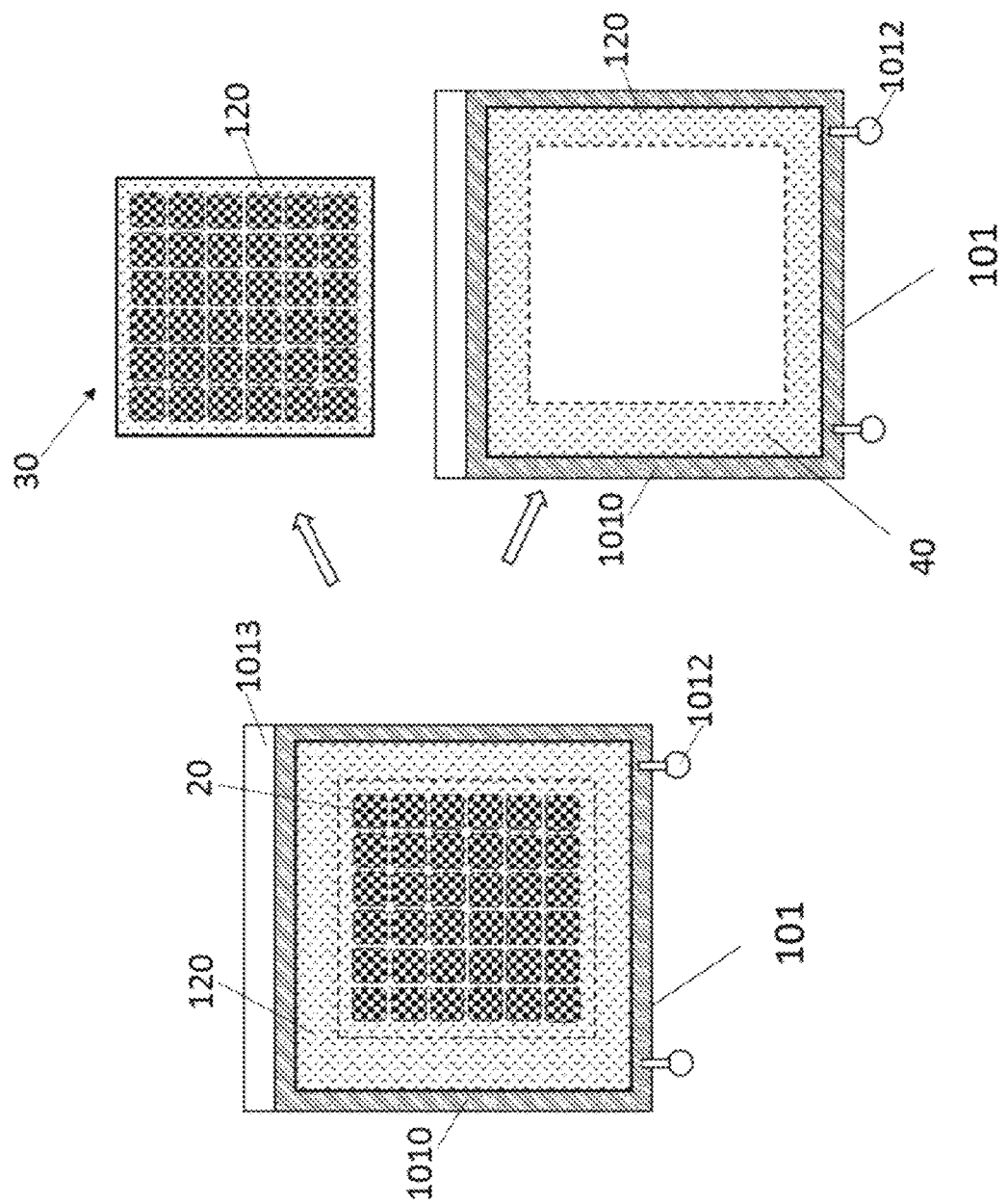
FIG. 13 illustrates a technique of removing processed wafers from the frame of FIG. 2.

As discussed with reference to item 182 in FIG. 1B, after the wafers 20 carried by the frame 101 have been processed to become respective modules, the modules (which are coupled together by the membrane 120) are then removed from the frame 101. As shown in FIG. 13, a substrate region in the middle of the membrane 120 is cut. The cut-out portion (e.g., first portion) of the membrane 120 becomes a part of a module 30 that also includes the substrates (processed wafers 20). The substrates are connected together through the first (cut-out) portion of the membrane 120.

It should be noted that the substrates do not need to be removed from the cut-out portion of the membrane 120, and the cut-out portion of the membrane 120 will become a part of the solar cell being formed. In particular, the module 30 (comprising the substrates connected by the cut-out membrane 120) may be connected to other module 30, and/or may be subjected to plastic packaging to form a solar cell.

As shown in FIG. 13, after the first portion of the membrane 120 is removed, the remaining (second) portion 40 of the membrane 120 remains attached to the perimeter portions 1010 of the frame 101. To prepare the frame 101 for processing a next set of wafers, the remaining portion 40 of the membrane 120 is removed. Then, a new membrane 120 is coupled to the frame 101 for manufacturing of the next solar cell. Thus, the frame 101 may be utilized multiple times. This has the benefit of reducing manufacturing cost.

Solar Cell

Figure 14:
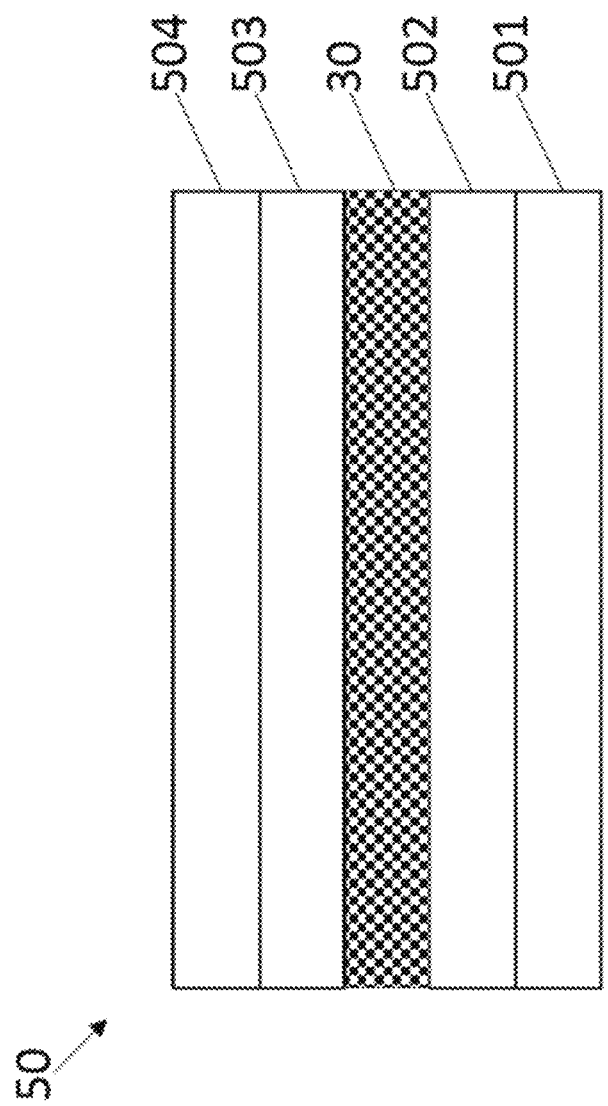
FIG. 14 illustrates a cross-sectional view of a solar cell module.

Referring to FIG. 14, to form a solar cell 50, a first plastic layer 502 and a second plastic layer 503 may be deposited on opposite surfaces of the module 30. The plastic layers 502, 503 may be respective plastic sealing layers. In one implementation, the plastic layers 502, 503 may be respective EVA films. A first glass 501 and a second glass 504 may also be placed on opposite sides of the module 30 to form the solar cell 50.

As discussed, the module 30 includes the cut-out membrane 120, which becomes a part of the solar cell 50. The cut-out membrane 120 has multiple membrane openings covered by respective substrates (wafers 20 with intrinsic layers and doping layers formed thereon), which are connected together by the cut-out membrane 120.

In some cases, each substrate of the module 30 has a first intrinsic layer (I-layer) and a N-layer on the first I-layer, wherein the first I-layer and the N-layer collectively may be considered a first (or front) film layer. Each substrate of the module 30 also has a second intrinsic layer (I-layer) and a P-layer on the second I-layer, wherein the second I-layer and the P-layer collectively may be considered a second (or back) film layer. In some embodiments, the first I-layer and the second I-layer may be made from amorphous silicon. Also, in some embodiments, the N-layer may be a doping layer comprises amorphous silicon and/or crystalline silicon doped with N-type ions, and the P-layer may be a doping layer comprises amorphous silicon and/or crystalline silicon doped with P-type ions.

In some cases, the solar cell 50 may be formed by connected multiple modules 30 together to form an assembly. FIG. 15A illustrates a module 30 having the cut-out membrane 120, and multiple substrates 20 (processed wafers with intrinsic layers and doping layers) connected together by the cut-out membrane 120. Before connecting the module 30 with another module 30, bus bars may be formed on opposite sides of the module 30 (as similarly discussed with reference to item 181 of FIG. 1B). In some embodiments, the bus bars are configured to collect and transmit charges from the solar cells. In the illustrated example, a first set of bus bars is formed on a first surface of the module 30, with the bus bars running in parallel and extending to a first edge of the module 30. A second set of bus bars is formed on a second surface (opposite from the first surface) of the module 30, with the bus bars running in parallel and extending to a second edge (opposite from the first edge) of the module 30. The first set of bus bars and the second set of bus bars are parallel to each other. In other embodiments, the first set of bus bars and the second set of bus bars may form a non-zero angle with respect to each other.

Figure 15C:
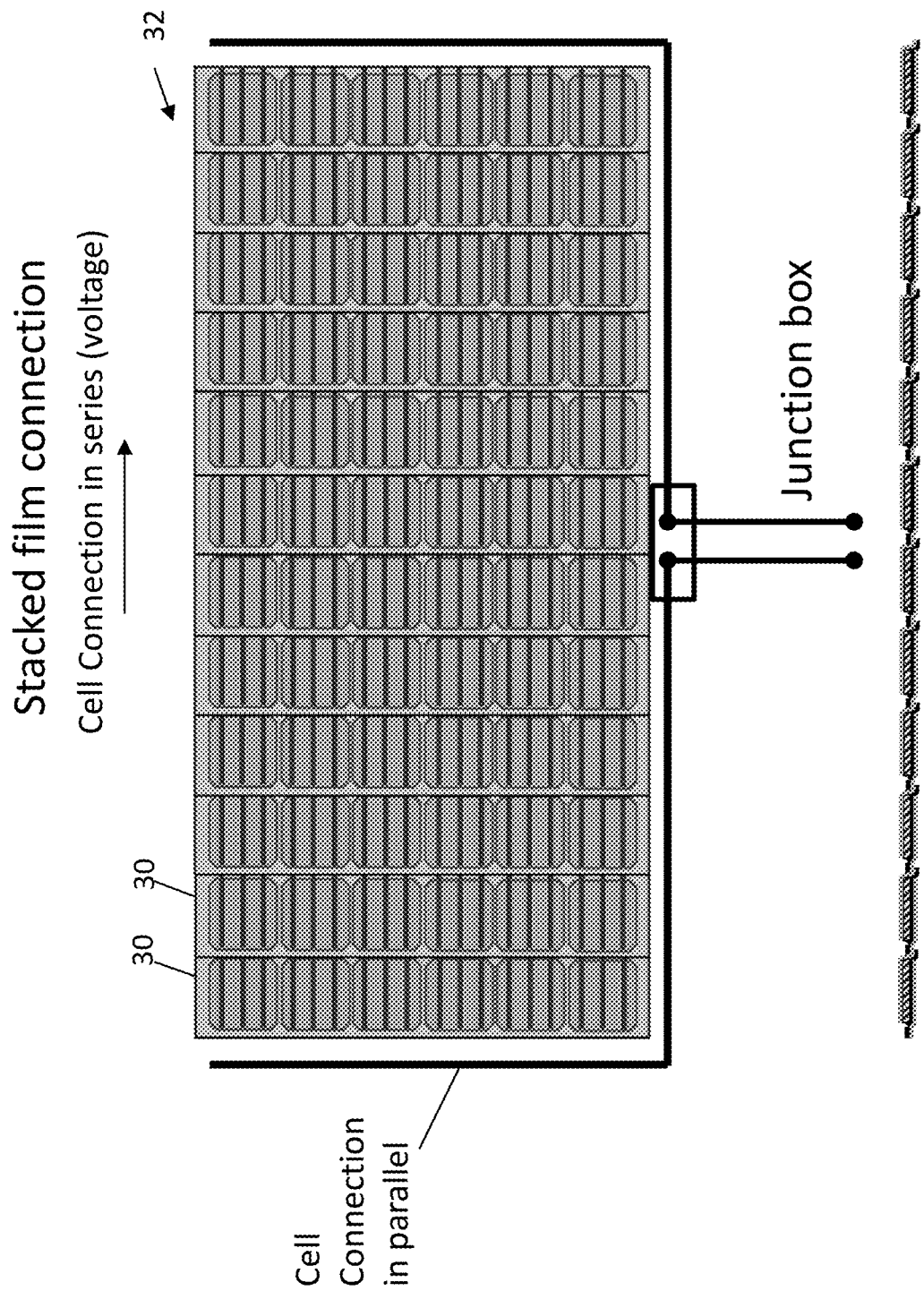
FIG. 15C illustrates twelve modules being coupled together to form an assembly.

FIG. 15B illustrates two modules 30*a*, 30*b* being coupled together to form an assembly 32. As shown in the figure, the second module 30*a* overlaps the first module 30*b* along a side. In particular, the second set of bus bars at the back side of the second module 30*b* extends It should be noted that the assembly 32 is not limited to having two modules 30 coupled to each other, and that the assembly 32 may have other number of modules 30. FIG. 15C illustrates twelve modules 30 being coupled together to form the assembly 32, with each module 30 having six substrates. Each module 30 has a first side (to which a first set of bus bars (e.g., top bus bars) extends) that is overlapped by a first adjacent module 30, and also has a second side (to which a second set of bus bars (e.g., bottom bus bars) extend) that overlaps a second adjacent module 30.

In some embodiments, adjacent overlapping modules 30 may be coupled to each other using adhesive that is applied between the overlapping areas of the respective modules 30. Because the top bus bars of one module 30 are aligned with the bottom bus bars of an adjacent module 30, when the two modules 30 overlap each other, the top bus bars of one module 30 will be in electrical contact with the bottom bus bars of the adjacent module 30. In other embodiments, no adhesive is needed, and the adjacent modules 30 may simply overlap each other.

Figure 16:
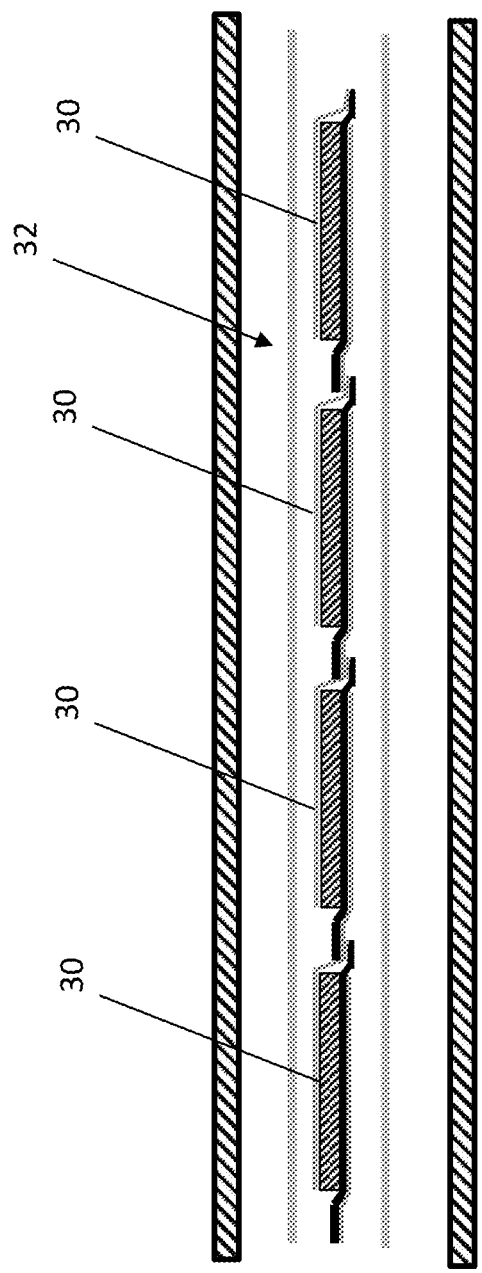
FIG. 16 illustrates an installation of polymeric films and glasses onto multiple modules.

After multiple modules 30 are coupled to each other to form the assembly 32, the assembly 32 may be further processed to form a solar cell 50. FIG. 16 illustrates an installation of polymeric films (e.g., EVA films) and glasses onto an assembly 32 with multiple modules 30. The polymeric films are first disposed on opposite surfaces of the assembly 32. The glasses are then disposed on opposite sides to contain the polymeric films and the assembly 32. The thickness of the solar cell 50 may be anywhere from 50 microns to 300 microns, such as anywhere from 100 microns to 180 microns.

Figure 17:
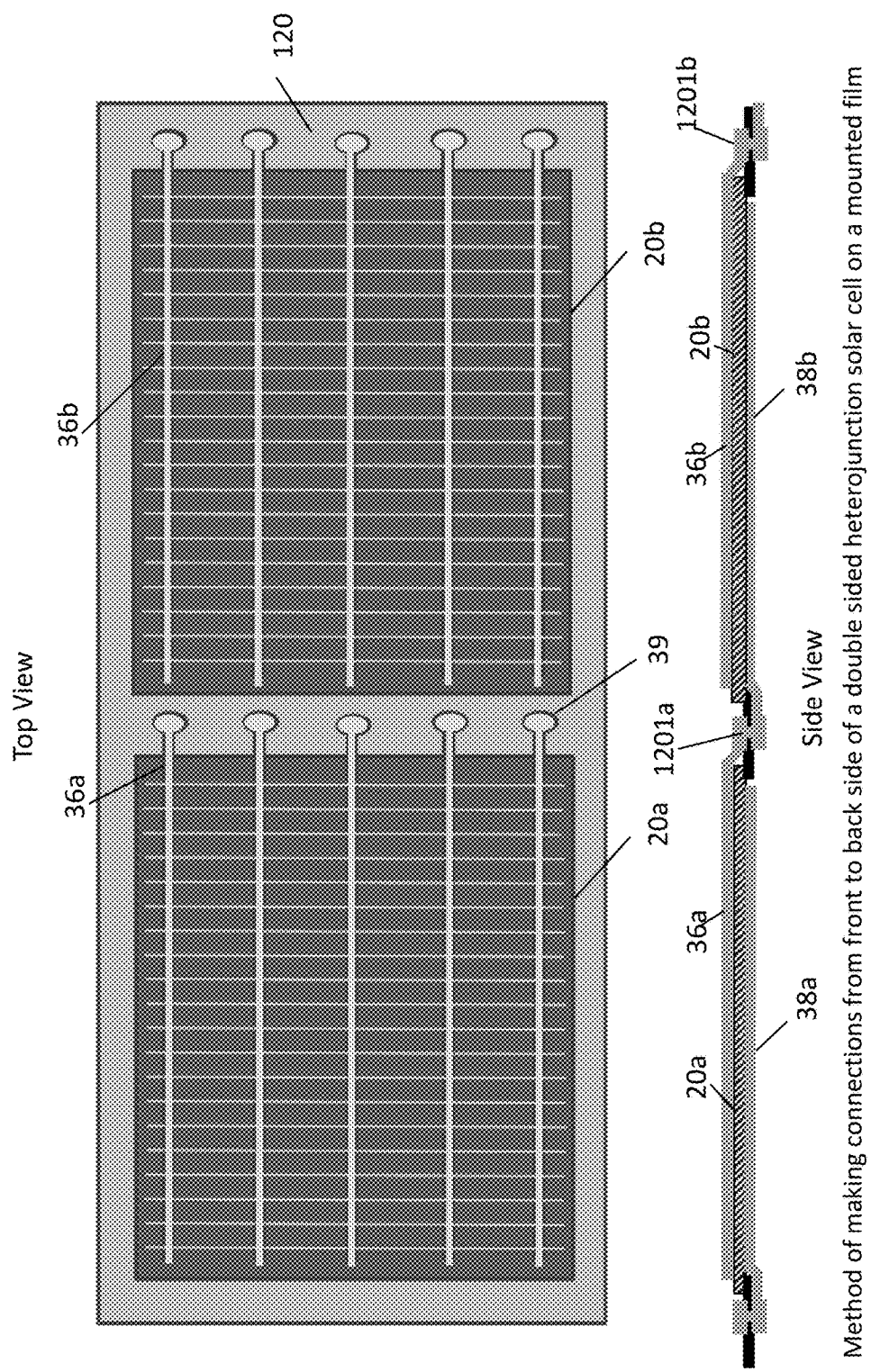
FIG. 17 illustrates a technique of electrically connecting two modules that are coupled to each other via a membrane.

In the above embodiments of FIGS. 15-16, multiple modules 30 (with each module 30 having a single-row of processed wafers) are coupled together via stacking. In some embodiments, a module 30 may have multiple rows of processed wafers that are coupled to a common membrane 120. In such cases, the adjacent rows of the processed wafers (substrates) on the same membrane 120 may be electrically connected to each other using. FIG. 17 illustrates a technique of electrically connecting two modules that are coupled to each other via a membrane. As shown in the figure, the membrane 120 connects a first wafer 20*a* and a second wafer 20*b*. The first wafer 20*a* is coupled to the membrane 120 and covers a first membrane opening 1201*a*. The second wafer 20*b* is coupled to the membrane 120 and overs a second membrane opening 1201*b*.

The first wafer 20*a* has been processed and includes an I-layer and a N-layer on a first surface of the first wafer 20*a*, and it also includes an I-layer and a P-layer on a second surface (opposite from the first surface) of the first wafer 20*a*. The first wafer 20*a* also includes a front conductive layer and a back conductive layer.

Similarly, the second wafer 20*b* has been processed and includes an I-layer and a N-layer on a first surface of the second wafer 20*b*, and it also includes an I-layer and a P-layer on a second surface (opposite from the first surface) of the second wafer 20*b*. The second wafer 20*b* also includes a front conductive layer and a back conductive layer. In some embodiments, each conductive layer may be an ITO layer.

As shown in the figure, a first set of bus bars (e.g., top bus bars) 36*a* and a second bus bars (e.g., bottom bus bars) 38*a* are formed, e.g., by printing, on opposite surfaces of the first wafer 20*a*. Similarly, a first set of bus bars (e.g., top bus bars) 36*b* and a second bus bars (bottom bus bars) 38*b* are formed, e.g., by printing, on opposite surfaces of the second wafer 20*b*. In some embodiments, the first set of bus bars 36*a* connects to surfaces of the front conductive layer (e.g., ITO layer), and the second set of bus bars 38*a* connects to surfaces of the back conductive layer (e.g., ITO layer).

To connect the top bus bars 36*a* of the first wafer 20*a* (substrate) to the bottom bus bars 38*b* of the adjacent second wafer 20*b* (substrate), a set of through-holes 39 may be made, such as by hole punching the membrane 120 utilizing a hole punching device, at locations that are between the wafers 20*a*, 20*b* (substrates). Next, conductive wires may be formed in the through-holes (and optionally on the surfaces of the substrates), thereby electrically connecting the top bus bars 36*a* of the first wafer 20*a* to the bottom bus bars 38*b* of the second wafer 20*b*.

In one implementation, through-holes are created on the membrane 120. Then top bus bars 36*a*, 36*b* are created on the top surfaces of the wafers 20*a*, 20*b* (e.g., using printing technique). The top bus bar 36*a* may overlap hole 1201*a*, and the top bus bar 36*b* may overlap the hole 1201*b*, so that the materials of the bus bars 36*a*, 36*b* will sink into the holes 1201*a*, 1201*b*, respectively. The materials may or may not go through the holes 1201*a*, 1201*b* completely. Next, the wafers 20*a*, 20*b* may be flipped over. Then, bottom bus bars 38*a*, 38*b* are created on the bottom surfaces of the wafers 20*a*, 20*b* (e.g., using printing technique). The bottom bus bar 38*b* overlaps the hole 1201*a* to connect to the top bus bar 36*a*. In some cases, material of the bottom bus bar 38*b* may sink into the hole 1201*a* (e.g., if the material of the top bus bar 36*a* extends only partially within the hole 1201*a*) to connect to the top bus bar 36*a*. In other cases, the material of the bottom bus bar 38*b* may not sink into the hole 1201*a* (e.g., if the material of the bus bar 36*a* extends through the hole 1201*a*) to connect to the top bus bar 36*a*. The bottom bus bar 38*a* connects to the top bus bar of the previous wafer (not shown in the figure) in front of the wafer 20*a*. The hole 1201*b* connects the top bus bar 36*b* of the wafer 20*b* to the bottom bus bar of the next wafer (not shown in the figure). In some cases, each bus bar may be a printed silver line.

Method

Figure 18:
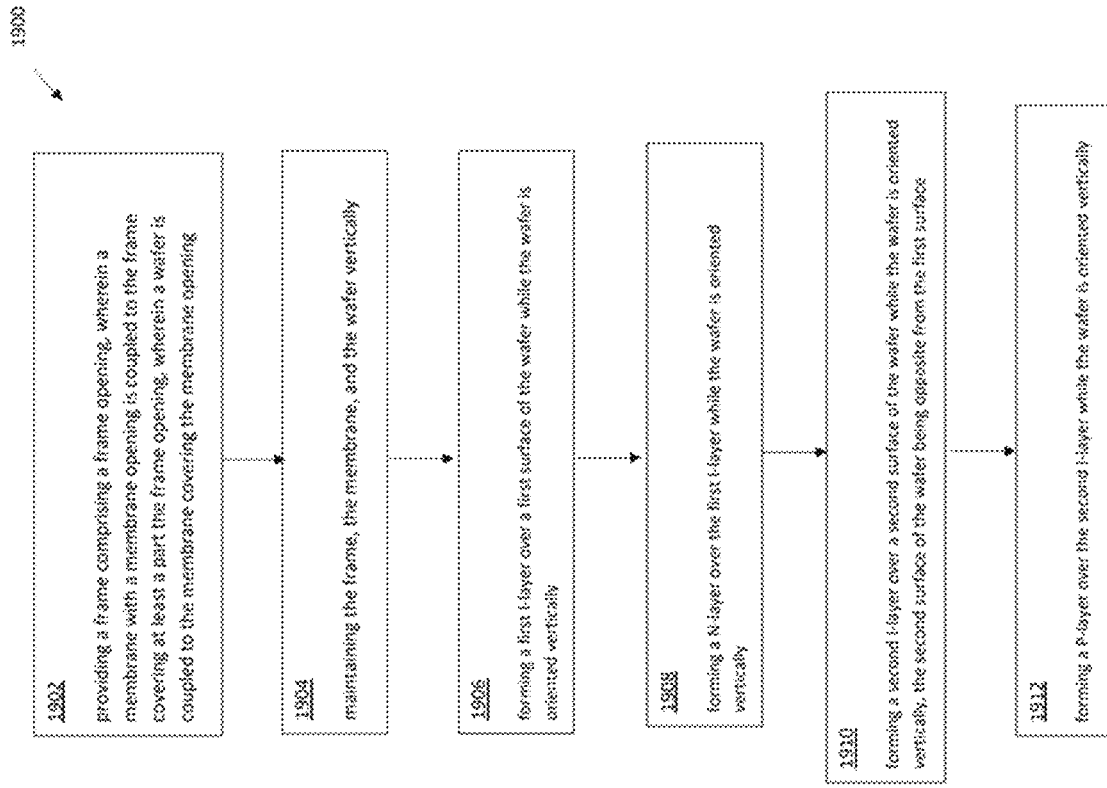
FIG. 18 illustrates a method.

FIG. 18 illustrates a wafer processing method 1900 in accordance with some embodiments. The wafer processing method 1900 includes: providing a frame comprising a frame opening, wherein a membrane with a membrane opening is coupled to the frame covering at least a part the frame opening, wherein a wafer is coupled to the membrane covering the membrane opening (item 1902); maintaining the frame, the membrane, and the wafer vertically (item 1904); forming a first I-layer over a first surface of the wafer while the wafer is oriented vertically (item 1906); forming a N-layer over the first I-layer while the wafer is oriented vertically (item 1908); forming a second I-layer over a second surface of the wafer while the wafer is oriented vertically, the second surface of the wafer being opposite from the first surface (item 1910); and forming a P-layer over the second I-layer while the wafer is oriented vertically (item 1912).

In other embodiments, item 1910 may be performed before item 1908, so that the layers are formed in the I-I-N-P sequence (instead of the I-N-I-P sequence). In other embodiments, the items in the method 1900 may be re-arranged so that the layers are formed in the I-N-I-P sequence, or in the I-P-I-N sequence.

Optionally, in the method 1900, the first I-layer, the N-layer, the second I-layer, and the P-layer are formed by performing Plasma Enhanced Chemical Vapor Deposition (PECVD).

Optionally, the method 1900 further includes: forming a first conductive layer over the first surface of the wafer; and forming a second conductive layer over the second surface of the wafer.

Optionally, in the method 1900, the first conductive layer comprises a first ITO layer, and the second conductive layer comprises a second ITO layer.

Optionally, the method 1900 further includes: forming a first conductive line over the first surface of the wafer while the wafer is coupled to the membrane, the first conductive line connecting to surfaces of the first conductive layer; and forming a second conductive line over the second surface of the wafer while the wafer is coupled to the membrane, the second conductive line connecting to surfaces of the second conductive layer.

Optionally, in the method 1900, the first conductive line extends beyond a first edge of the wafer.

Optionally, in the method 1900, the second conductive line extends beyond a second edge of the wafer, the second edge being opposite from the first edge of the wafer.

Optionally, in the method 1900, the wafer, at least a part of the membrane, the first I-layer, the N-layer, the second I-layer, the P-layer, the first conductive layer, and the second conductive layer, together form a first module; and wherein the method further comprises connecting the first module and a second module to form an assembly.

Optionally, in the method 1900, the first module and the second module are connected using an adhesive.

Optionally, in the method 1900, the second module comprises a second wafer, a first conductive line over a first surface of the second wafer, and a second conductive line over a second surface of the second wafer, the second surface of the second wafer being opposite from the first surface of the second wafer; and wherein when the first module and the second module are connected, the first conductive line over the first surface of the first wafer is electrically connected to the second conductive line over the second surface of the second wafer.

Optionally, the method 1900 further includes: placing a first polymeric film and a second polymeric film on opposite surfaces of the assembly; and clamping the first polymeric film, the assembly, and the second polymeric film between a first glass and a second glass.

Optionally, in the method 1900, the first module comprises a solar cell module.

Optionally, the method 1900 further includes texturing the first surface and the second surface of the wafer while the wafer is oriented vertically, wherein the act of texturing is performed before the first I-layer, the N-layer, the second I-layer, and the P-layer are formed.

Optionally, the method 1900 further includes moving the frame, the membrane, and the wafer together to a plurality of processing stations, wherein the act of moving is performed while the wafer is oriented vertically.

Optionally, the method 1900 further includes removing the membrane from the frame.

Optionally, in the method 1900, the wafer is for making a solar module, and wherein the method further comprises coupling another membrane to the frame, and coupling another wafer to the membrane to make another solar module.

Optionally, in the method 1900, peripheral portions of the membrane are coupled to parts of the membrane that define the membrane opening, and form a seal with the parts of the membrane that define the membrane opening.

Optionally, in the method 1900, the membrane comprises an additional membrane opening, wherein an additional wafer is coupled to the membrane covering the additional membrane opening.

Optionally, the method 1900 further includes providing texturing treatment on opposite surfaces of the wafer. The texturing treatment may be achieved using dry etching.

Optionally, the method 1900 further includes, before the act of providing texturing treatment, coupling the membrane with a first isolation grid, wherein the first isolation grid is coupled to a first surface of the membrane.

Optionally, the method 1900 further includes coupling the membrane with a second isolation grid, wherein the second isolation grid is coupled to a second surface of the membrane, the second surface of the membrane being opposite from the first surface of the membrane.

Optionally, in the method 1900, the first isolation grid is configured to isolate the wafer from an additional wafer that is also coupled to the membrane, wherein at least a part of the first isolation grid is located between the wafer and the additional wafer.

Optionally, the method 1900 further includes forming a first conductive layer over the N-layer, and forming a second conductive layer over the P-layer, wherein the first conductive layer extends over the wafer, across a spacing between the wafer and the additional wafer, and over the additional wafer.

Optionally, the method 1900 further includes removing the first isolation grid, wherein the removing the first isolation grid causes a part of the first conductive layer extending over the spacing between the wafer and the additional wafer to be removed, thereby electrically isolating the wafer and the additional wafer.

Optionally, the method 1900 further includes removing, using a laser device, a part of the first conductive layer that is across the spacing between the wafer and the additional wafer.

Optionally, in the method 1900, the wafer is processed to form a first module, and the method also comprises: forming a second module using an additional wafer; and electrically coupling a conductor on a front surface of the first module with a conductor on a back surface of the second module.

Optionally, in the method 1900, the act of electrically coupling comprises stacking a part of the second module over a part of the first module, so that the conductor on the front surface of the first module is in contact with the conductor on the back surface of the second module.

Optionally, in the method 1900, the act of electrically coupling comprises: making a hole through a thickness of the membrane at a location that is between the wafer and the additional wafer; and forming an electrical conductor in the hole.

Variation of the Manufacturing System

Figure 19A:
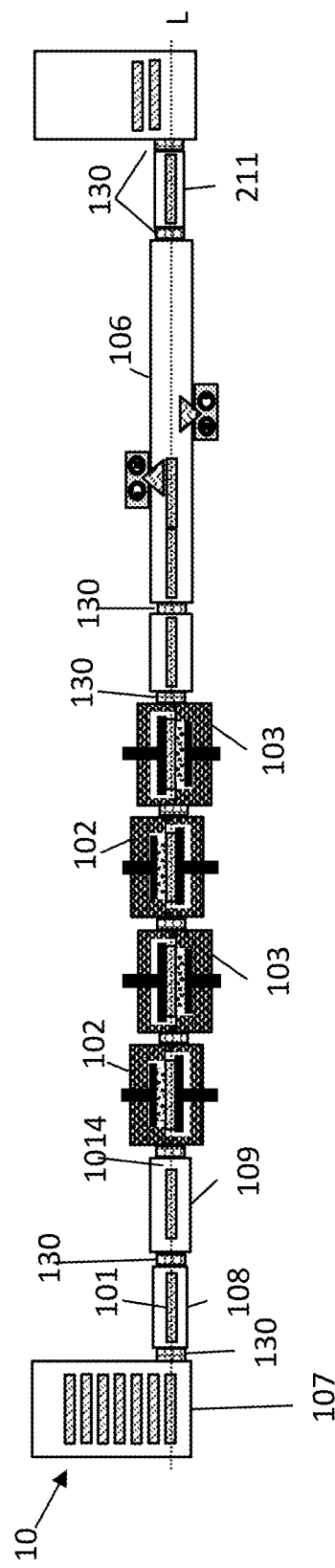
FIG. 19A illustrates another system for wafer processing.

FIG. 19A illustrates a variation of the manufacturing system 10. The system 10 of FIG. 19A is the same as that shown in FIG. 1A, except that the system 10 of FIG. 19A does not include a texturing station. In the system 10 of FIG. 19A, there is a first front film station 102 configured to form the I-layer on a first side of the wafer, and a second front station 102 configured to form the N-layer on the first side of the wafer in a two-step process. The system 10 also has a first back film station 103 configured to form the I-layer on a second side of the wafer, and a second back film station 103 configured to form the P-layer on the second side of the wafer. In some embodiments, the film stations 102, 103 may be configured to grow microcrystalline layer for the N and P doped layers. Also, in some embodiments, the I-layer may be amorphous Si:H layer. During use of the system 10 of FIG. 19A, the wafers carried by the frame 101 are subjected to texturing treatment before entering the preparation cavity 107. In some cases, the texturing treatment is performed on the front and back surfaces of the wafers by dry etching in a dry etching cavity. In other cases, the texturing treatment is performed on the front and back surfaces of the wafers by wet etching.

Figure 19B:
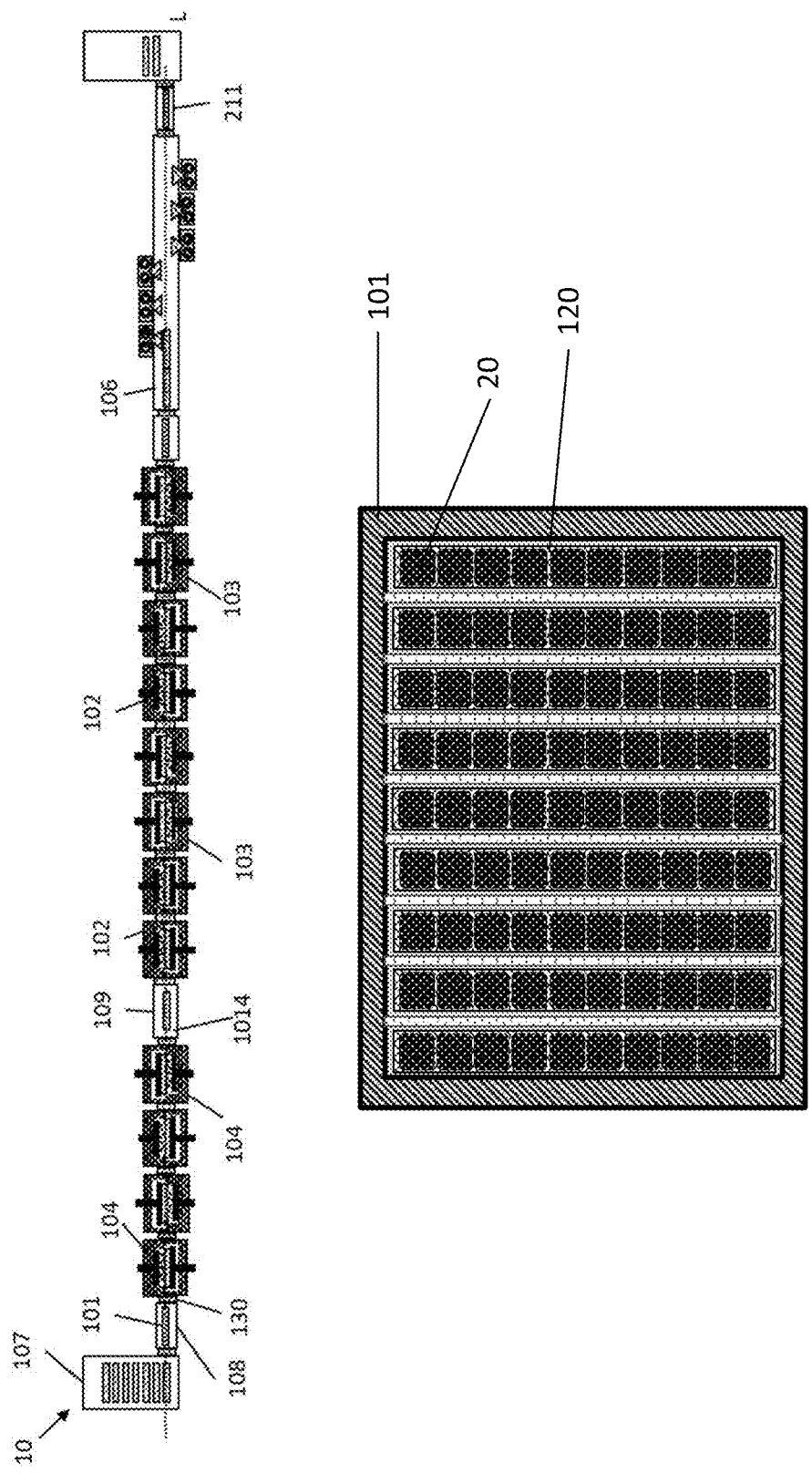
FIG. 19B illustrates another system for wafer processing.

FIG. 19B shows how a system 10 can expand in capacity by adding additional processing modules to the system 10. As shown in the figure, the system 10 is a vertical system with four RIEs, eight PECVDs, and six PVDs. The system 10 is configured to process a matrix of 9×10 wafers. In other embodiments, the system 10 may be configured to process other number of wafers. In some embodiments, the capacity of the system 10 may be expanded by adding similar chambers adjacent to current chamber. Such technique map allow the processing time to be shortened (e.g., split in half). Also, in some embodiments, the dry-etch system may be expanded in capacity in a similar manner. Furthermore, in some embodiments, the PDV system may have additional cathode assemblies, and movement of the frame may be sped up to achieve the same deposition thickness while increasing the throughput of the system.

The use of the terms "first", "second", "third" and "fourth", etc. does not imply any particular order, but are included to identify individual elements. Moreover, the use of the terms first, second, etc. does not denote any order or importance, but rather the terms first, second, etc. are used to distinguish one element from another. Note that the words first and second are used here and elsewhere for labelling purposes only and are not intended to denote any specific spatial or temporal ordering. Furthermore, the labelling of a first element does not imply the presence of a second element and vice versa.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

The invention claimed is:

1. A system for processing a wafer, the system comprising:
   a frame comprising a frame opening extending through a frame thickness of the frame; and
   a membrane configured to couple to the frame and to cover at least a part of the frame opening, the membrane comprising a membrane thickness and a membrane opening extending through the membrane thickness, wherein the membrane opening has a membrane opening area that is equal to or less than a frame opening area of the frame opening;
   wherein the membrane is configured for coupling with the wafer, wherein when the wafer is coupled with the membrane, the wafer covers the membrane opening, and wherein the membrane is configured to maintain the wafer at a certain position with respect to the frame; and
   wherein the membrane opening area is less than a total area of the wafer.

2. The system of claim 1, further comprising the wafer, wherein the wafer is coupled to the membrane, and covers the membrane opening.

3. The system of claim 2, wherein the wafer is coupled to the membrane via an adhesive or via one or more clamps.

4. The system of claim 1, wherein at least a part of the membrane is a component of a solar cell.

5. The system of claim 1, further comprising a transport mechanism configured to transport the frame while the membrane is coupled to the frame, and while the wafer is coupled to the membrane.

6. The system of claim 5, wherein the frame comprises a first magnet, and wherein the transport mechanism comprises a second magnet configured to interact with the first magnet of the frame to maintain the frame at a certain position with respect to the transport mechanism.

7. The system of claim 5, further comprising a plurality of processing stations, wherein the transport mechanism is configured to move the frame, the membrane, and the wafer sequentially to the processing stations.

8. The system of claim 7, wherein the processing stations comprise at least two stations selected from the group consisting of an etching station configured to provide dry etching for the wafer, a PECVD station configured to provide PECVD deposition for the wafer, a pre-heat station, and a PVD station configured to provide PVD deposition for the wafer.

9. The system of claim 1, further comprising a storage configured to house a plurality of frames that carry a plurality of wafers, wherein one of the plurality of frames is the frame with the frame opening, and wherein one of the plurality of wafers is the wafer that is coupled to the membrane.

10. The system of claim 1, wherein the membrane is configured to form a seal around the wafer.

11. The system of claim 1, wherein the system is configured to process the wafer to make one or more solar cells.

12. The system of claim 1, further comprising a vertical retention mechanism configured to maintain the frame vertically.

13. The system of claim 1, wherein the frame comprises opposite sides defining a frame width, wherein the frame width is larger than the frame thickness.

14. A system for processing a wafer, the system comprising:
- a frame comprising a frame opening; and
- a membrane configured to couple to the frame and to cover at least a part of the frame opening, the membrane comprising a membrane opening, wherein the membrane opening has a membrane opening area that is equal to or less than a frame opening area of the frame opening;
- wherein the membrane is configured for coupling with the wafer, wherein when the wafer is coupled with the membrane, the wafer covers the membrane opening, and wherein the membrane is configured to maintain the wafer at a certain position with respect to the frame;
- wherein the membrane opening area is less than a total area of the wafer; and
- wherein the membrane is under tension when the membrane is coupled to the frame.

15. A system for processing a wafer, the system comprising:
- a frame comprising a frame opening; and
- a membrane configured to couple to the frame and to cover at least a part of the frame opening, the membrane comprising a membrane opening, wherein the membrane opening has a membrane opening area that is equal to or less than a frame opening area of the frame opening;
- wherein the membrane is configured for coupling with the wafer, wherein when the wafer is coupled with the membrane, the wafer covers the membrane opening, and wherein the membrane is configured to maintain the wafer at a certain position with respect to the frame;
- wherein the membrane opening area is less than a total area of the wafer; and
- wherein the membrane comprises an additional membrane opening, wherein the membrane is configured to couple with an additional wafer so that the additional wafer covers the additional membrane opening.

16. A system for processing a wafer, the system comprising:
- a frame comprising a frame opening; and
- a membrane configured to couple to the frame and to cover at least a part of the frame opening, the membrane comprising a membrane opening, wherein the membrane opening has a membrane opening area that is equal to or less than a frame opening area of the frame opening;
- wherein the membrane is configured for coupling with the wafer, wherein when the wafer is coupled with the membrane, the wafer covers the membrane opening, and wherein the membrane is configured to maintain the wafer at a certain position with respect to the frame;
- wherein the membrane opening area is less than a total area of the wafer; and
- wherein the frame comprises a plasma resistant coating.

17. A system for processing a wafer, the system comprising:
- a frame comprising a frame opening; and
- a membrane configured to couple to the frame and to cover at least a part of the frame opening, the membrane comprising a membrane opening, wherein the membrane opening has a membrane opening area that is equal to or less than a frame opening area of the frame opening;
- wherein the membrane is configured for coupling with the wafer, wherein when the wafer is coupled with the membrane, the wafer covers the membrane opening, and wherein the membrane is configured to maintain the wafer at a certain position with respect to the frame;
- wherein the membrane opening area is less than a total area of the wafer; and
- wherein the system further comprises a first isolation grid disposed on a first surface of the membrane, and a second isolation grid disposed on a second surface of the membrane, wherein the second surface of the membrane is opposite from the first surface of the membrane.

18. A solar cell assembly, comprising:
- a first module having a first substrate with a first surface and a second surface opposite the first surface, the first module also having a first conductive wire disposed over the first surface of the first substrate, and a second conductive wire disposed over the second surface of the first substrate;
- a second module having a second substrate with a first surface and a second surface opposite the first surface, the second module also having a first conductive wire disposed over the first surface of the second substrate, and a second conductive wire disposed over the second surface of the second substrate; and
- a membrane comprising a first membrane opening extending through a membrane thickness, and a second membrane opening extending through the membrane thickness, wherein the first substrate and the second substrate are coupled to a first surface of the membrane, wherein the first substrate covers the first membrane opening, and wherein the second substrate covers the second membrane opening;
- wherein the membrane comprises a through hole at a location that is between the first substrate and the second substrate; and
- wherein the first conductive wire of the first module is electrically connected to the second conductive wire of the second module via a conductor located in the through hole of the membrane.

19. The solar cell assembly of claim 18, wherein the first module further comprises a first I-layer disposed over the first surface of the first substrate, a second !-layer disposed over the second surface of the first substrate, a N-layer disposed above the first I-layer, and a P-layer disposed over the second I-layer.

20. The solar cell assembly of claim 19, further comprising a first polymeric film and a second polymeric film, wherein the first module, the second module, and the membrane are located between the first polymeric film and the second polymeric film.

21. The solar cell assembly of claim 20, further comprising a first glass and a second glass, wherein the first polymeric film and the second polymeric film are between the first glass and the second glass.

22. A solar cell assembly, comprising:
- a first module having a first membrane with a first membrane opening, and a first substrate covering the first membrane opening, wherein the first substrate has a first surface and a second surface opposite the first surface, wherein the first module also has a first conductive wire disposed over the first surface of the first substrate, and a second conductive wire disposed over the second surface of the first substrate; and
- a second module having a second membrane with a second membrane opening, and a second substrate covering the second membrane opening, wherein the second substrate has a first surface and a second surface opposite the first surface, wherein the second module also has a first conductive wire disposed over the first surface of the second substrate, and a second conductive wire disposed over the second surface of the second substrate;

wherein a part of the first conductive wire of the first module extends beyond an edge of the first substrate, and is located on the first membrane;

wherein a part of the second conductive wire of the second module extends beyond an edge of the second substrate, and is located on the second membrane; and wherein a part of the second membrane overlaps a part of the first membrane, so that the first conductive wire of the first module is electrically coupled to the second conductive wire of the second module.

23. The solar cell assembly of claim 22, wherein the first module further comprises a first I-layer disposed over the first surface of the first substrate, a N-layer disposed above the I-layer, a second I-layer disposed over the second surface of the first substrate, and a P-layer disposed over the second I-layer.

24. The solar cell assembly of claim 23, further comprising a first polymeric film and a second polymeric film, wherein the first module, the second module, and the membrane are located between the first polymeric film and the second polymeric film.

25. The solar cell assembly of claim 24, further comprising a first glass and a second glass, wherein the first polymeric film and the second polymeric film are between the first glass and the second glass.

* * * * *